United States Patent
Poehl et al.

(10) Patent No.: US 7,451,373 B2
(45) Date of Patent: Nov. 11, 2008

(54) CIRCUIT FOR COMPRESSION AND STORAGE OF CIRCUIT DIAGNOSIS DATA

(75) Inventors: Frank Poehl, München (DE); Jan Rzeha, Wiltstock Ot Seweleow (DE); Matthias Beck, München (DE); Michael Goessel, Mahlow (DE); Peter Muhmenthaler, Hohenbrunn (DE)

(73) Assignee: Infineon Technologies AG, Neubiberg (DE)

( * ) Notice: Subject to any disclaimer, the term of this patent is extended or adjusted under 35 U.S.C. 154(b) by 205 days.

(21) Appl. No.: 11/367,715

(22) Filed: Mar. 6, 2006

(65) Prior Publication Data

US 2006/0284637 A1 Dec. 21, 2006

Related U.S. Application Data

(60) Provisional application No. 60/691,275, filed on Jun. 17, 2005.

(51) Int. Cl.
*G01R 31/28* (2006.01)
(52) U.S. Cl. ..................... 714/740; 714/726
(58) Field of Classification Search .............. 714/726, 714/740, 724, 735, 736, 819, 719, 752, 760, 714/799, 3, 48; 716/4
See application file for complete search history.

(56) References Cited

U.S. PATENT DOCUMENTS 5,809,040 A 9/1998 Dallmann et al.
6,781,398 B2 8/2004 Adler et al.
7,185,253 B2 * 2/2007 Mitra et al. ............... 714/734
2005/0055613 A1 * 3/2005 Mitra et al. ............... 714/726
2007/0088999 A1 * 4/2007 Chao et al. ............... 714/726

FOREIGN PATENT DOCUMENTS

DE 10137745 A1 3/2002

OTHER PUBLICATIONS

C. Hora, et al., "An Effective Diagnosis Method to Support Yield Improvement", Proc. ITC, pp. 260-269, 2002.
K. Barnhart, et al., "OPMISR: The Foundation for Compressed ATPG Vectors", Proc. ITC, pp. 748-757, 2001.
S. Mitra, et al., "X-compact: An Efficient Response Compaction for Test Cost Reduction", Proc. ITC, pp. 311-320, 2002.
J. Rajski, et al., "Convolution compaction of test responses", Proc. ITC, pp. 745-754, 2003.
Kundu, S. Sogomonyan, et al., "Self-Checking Comparator with One Periodic Out-put", IEEE Trans. Comp. vol. 45, No. 3 pp. 379-380, 1996.

(Continued)

*Primary Examiner*—Phung M Chung
(74) *Attorney, Agent, or Firm*—Edell, Shapiro & Finnan, LLC

(57) ABSTRACT

A compactor includes test data inputs that are connectable to circuit outputs of an electrical circuit, test comparison inputs, and test data outputs. The compactor further includes a number of H matrix XOR gates arranged as a switching mechanism between the test data inputs and the test data outputs such that data applied to the test data inputs is produced at the test data outputs compressed in accordance with coefficients of an H matrix of an error-correcting code, and compensation XOR gates arranged between the test data inputs and the test data outputs, each compensation XOR gate including an input for receiving a compensation value.

32 Claims, 10 Drawing Sheets

OTHER PUBLICATIONS

Dmitriev, et al., "Robust Space Compaction of Test Responses", Test Symposium, 2002 (ATS '02), Proceedings of the 11th Asian Nov. 18-20, 2002, Piscataway, NJ, USA, IEEE, Nov. 18, 2002, pp. 254-259, XP010628379, ISBN: 0-7695-1825-7.

Patel, et al., "Application of Saluja-Karpovsky compactors to test responses with many unknowns" VLSI Test Symposium, 2003, Proceedings, 21st Apr. 27-May 1, 2003, Piscataway, NJ, USA, IEEE, Apr. 27, 2003, pp. 107-112, XP010638730, ISBN: 0-7695-1924-5.

Mitra, et al., "X-compact an efficient response compaction technique for test cost reduction" Proceedings international Test Conference 2002. ITC 2002, Baltimore, MD, Oct. 7-10, 2002, International Test Conference, New York, NY; IEEE, US, Oct. 7, 2002 (2002-10-047, pp. 311-320, XP010609755, ISBN: 0-7803-7542-4.

* cited by examiner

US 7,451,373 B2

CIRCUIT FOR COMPRESSION AND STORAGE OF CIRCUIT DIAGNOSIS DATA

CROSS REFERENCE TO RELATED APPLICATIONS

This application claims priority under 35 U.S.C. §119(e) to U.S. Provisional Patent Application No. 60/691,275, filed on Jun. 17, 2005, and titled "Circuit for Compression and Storage of Circuit Diagnosis Data," the entire contents of which are hereby incorporated by reference.

FIELD OF THE INVENTION

The invention relates to the testing and diagnosis of large integrated electrical circuits, such as VLSI circuits having a large number of outputs to be monitored during testing and during diagnosis.

BACKGROUND

It is typical for modern VLSI circuits to have a very large number of outputs and, in particular, a very large number of outputs of scan paths. DE 195 36 226 A1 discloses how errors can be identified by supplying an external comparison vector in the test mode, by direct comparison of the actual test results at the outputs of the circuit with a comparison vector which is supplied to the circuit. When an error is identified, the result of the bit-by-bit comparison is emitted, once again bit-by-bit, in order to diagnose the result. In this case, the respective externally supplied comparison vector has the same word length as the test response vector which is emitted from the tested circuit and as the test results which are produced at the circuit output. The procedure described in the aforementioned document is accordingly complex for circuits having a large number of outputs. The long word length of the supplied test vector which is required in this case, the bit-by-bit comparison for the large number of bits to be compared and, in the case of diagnosis, the outputting of the large number of bits are in this case complex. This becomes clear if one considers circuits with about 1,000 to 2,000 outputs which, for example, may be outputs of scan paths. These outputs must be monitored during testing and, all the more, during diagnosis. Furthermore, the number of test input vectors is frequently on the order of several hundred to several thousand test vectors. A further disadvantage is that this method cannot be used in all situations.

DE 101 37 745 describes the storage of diagnosis data on a chip. However, this is not feasible with modern chips, owing to the additional area requirement.

SUMMARY

The invention provides an improved test and diagnosis method for circuits having M outputs to be tested, for example outputs of M scan paths, data which is emitted during the test and/or the diagnosis, while M may be a larger number. The invention takes into account that the verification of a circuit is particularly complicated when its scan paths also contain undefined values as test responses, whose binary values are unpredictable. Tests can also be performed when undefined values (so-called X values) occur in the test responses from the circuits.

Furthermore, the invention makes it possible to match the word length of the comparison vector (which is supplied, by way of example, by the tester) and thus the required complexity to the desired error coverage of the test and diagnosis.

Testing and diagnosis of circuits under consideration are performed according to the invention with as small a number as possible of outputs to be monitored. Testing and diagnosis are also possible with little complexity in the presence of undefined values. Furthermore, in the situation where an error is being diagnosed, only a small amount of data, which allows the definition of the error, is emitted to the exterior from the chip for diagnosis.

According to the invention, the M outputs of the circuit to be tested and/or to be diagnosed are connected to the M test data inputs $E_1, \ldots, E_M$ of a linear compactor K, the test inputs being introduced into the circuit, the circuit supplying the test outputs corresponding to a length of M bits. The compactor K furthermore has k test comparison inputs $v_1^i, \ldots, v_k^i$ and m test data outputs or syndrome outputs $S_1, \ldots, S_m$. For each input of a test output which is supplied to the test data inputs of the compactor from the circuit to be tested and/or to be diagnosed, test comparison values which have a length of k bits and are determined in advance on the basis of the test data are entered in the k test comparison inputs $v_1^i, \ldots, v_k^i$. In this case, m<M and m≦k≦M. The linear compactor logically links the values, which have a length M bits and are entered at its test data inputs, by means of XOR gates corresponding to the coefficients of the H matrix of a linear, error-correcting code and the k comparison values $v_1^i, \ldots, v_k^i$, which are produced by the tester at its test comparison inputs, by further XOR gates. The logic linking process is performed such that, in the event of an error-free case—i.e., when error-free test responses from the circuit are entered in the test data inputs of the compactor and of the predetermined comparison values which are produced by an external tester, to the k test comparison inputs—a characteristic value which can easily be identified is emitted at the outputs $S_1, \ldots, S_m$ of the compactor. In one particularly simple case, the circuit is designed such that, when there are no errors, the value $$\underbrace{0,0,\ldots,0}_{m}$$

is emitted at the outputs $S_1, \ldots, S_m$.

If the circuit S has a fault and if, consequently, the circuit S produces a faulty test output, then the compactor K deals with these test outputs which are applied to the M test inputs on the basis of an error-correcting code which is defined by the H matrix, such that a characteristic fault syndrome is emitted instead of the faulty test outputs. A person skilled in the art can deduce the cause of the fault from a fault syndrome such as this.

At least one subset of the k lines of the compactor which carry the value 0 when there are no faults, after XOR logic linking with the externally provided data, is or are furthermore logically linked with the inputs of an OR gate, whose binary output signal 1 indicates an error, and whose binary output signal 0 indicates no error. This provides a simple error indication. While an error signal 1 is present at the output of these OR gates, the m values which are emitted at the m outputs of the compactor and which form the fault syndrome of the present error for the error-correcting code under consideration and which allow the incorrectly emitted test or diagnosis data to be determined solely from the values of this fault syndrome, which have a length of only m bits. This data can be either evaluated directly or can be temporarily stored for subsequent evaluation on the chip or externally. In advantageous refinements, the compactor is chosen to be a linear compactor. Instead of the OR gate which logically links a subset of the k lines to an error signal, it is also possible to use a NOR gate. In the event of an error, the value "0" is then emitted, with the value "1" being emitted when there is no error.

In this case, it is advantageous that syndrome vectors with a length of only m bits need be evaluated for diagnosis of the incorrect data, rather than all M outputs of the circuit. In many practical situations, $m \leq C \log_2(M)$, where C is in many cases a constant between 1 and 2. In the case, by way of example, of the circuit having M=1,000 data outputs, it is thus possible, depending on the error-correcting code that is used, to consider only about 10 to 20 bits in the fault syndrome. This therefore reduces the amount of data to be evaluated in the event of an error by 98% to 99%.

The invention provides a compactor K, which may also be a compactor circuit or electrical circuit which provides a compactor. The compactor has a total number M of test data inputs, which are connected to circuit outputs A of an electrical circuit S, as well as a total number k of test comparison inputs and a total number m of test data outputs. The compactor K may be a linear compactor. This has a number of H matrix XOR gates, which are arranged as a switching mechanism between the test data inputs and the test data outputs such that the data which is applied to its test data inputs is produced at the test data outputs compressed in accordance with the coefficients of an H matrix of a linear, error-correcting code.

The compactor K also has compensation XOR gates, which are arranged in the area between the test data inputs and the test data outputs, with one input of a compensation XOR gate being provided for inputting a compensation value, which is also produced externally. These compensation values may also be compacted test comparison values.

The circuit arrangement according to the invention has an electronic circuit S to be tested and/or to be diagnosed with a number of circuit inputs for inputting input data or test inputs, and with a total number M of circuit outputs A for emitting output data or test outputs with a length of M bits.

A compactor K, which is also linear, and has a total number M of test data inputs, which are connected to the circuit outputs A, and with a total number k of test comparison inputs and with a total number m of test data outputs is designed as described above, with the compactor K having a number of H matrix XOR gates, which are arranged as a switching mechanism between the test data inputs and the test data outputs such that the data which is applied to its test data inputs is produced at the test data outputs compressed in accordance with the coefficients of an H matrix of a linear, error-correcting code.

The compactor K also has compensation XOR gates, which are arranged in the area between the test data inputs and the test data outputs, with in each case one input of one compensation XOR gate being provided for inputting a compensation value, which is also external, or a compacted test comparison value.

Furthermore, one or more error indication circuits may be provided, whose inputs are connected to at least some of the lines of the compactor K and which emits an error indication signal f. In this case, it should be noted that the invention also operates when only the syndrome outputs or only the error indication signal is considered. A particularly good implementation is obtained when both components are present, because testing can then be performed easily and any errors or faults which occur may nevertheless be considered in a space-saving and economic form.

The compensation XOR gates may be arranged downstream from H matrix XOR gates and upstream the test data outputs $(S_1, \ldots, S_m)$ in the signal flow direction. As an alternative to this, the compensation XOR gates may also be arranged upstream of the H matrix XOR gates and downstream from the test data inputs in the signal flow direction. Finally, it is also possible to arrange the compensation XOR gates between the H matrix XOR gates, the test data outputs and the test data inputs in the signal flow direction, in such a way that this results in a predetermined compression rate of the test result and a predetermined error indication probability for an error situation. The respective advantages and disadvantages of these variants will be explained in detail and will be compared with one another.

The error indication circuit may simply be in the form of an OR gate or else a combined switching mechanism that emits an error signal when the number of error signals which are applied to its inputs exceeds a predetermined threshold value.

A masking input for inputting a predetermined number of masking signals may be provided upstream of one or more test data inputs. In precisely the same way, one masking device may be arranged upstream of one or more test data outputs of the compactor K, having a masking input for inputting a predetermined masking signal. According to the invention, it is also possible to arrange one masking device upstream of one or more compensation XOR gates, which has a masking input for inputting a predetermined masking signal. These measures make it possible to tap off undefined values and to replace them by a defined value.

A first circuit with m XOR gates, with m AND gates and with m multiplexers is particularly suitable for processing X values, with an output of the compactor K which carries an intermediate syndrome value Si' being connected to the first input of an XOR gate and at the same time to the 0-input of a multiplexer, and with the output of the AND gate being applied to the second input of the XOR gate. Furthermore, an output, which carries an error signal f, of the compactor is passed to the first input of the AND gate. In this case, it is advantageous for a second circuit with at least one OR gate and with at least one further AND gate to be provided as well for error indication when X values such as these occur, with the output of the XOR gate at the same time being passed to the 1-input of the multiplexer and to the i-th input of the OR gate, which emits an error signal f at its output. This then results in a simple error indication.

According to the invention, at least one masking device may also be arranged immediately downstream from a compensation XOR gate, in which case one input of one or more compensation XOR gate and one input of a masking device can be connected to one another so as to produce a common drive. The masking device may in this case be an OR gate, an AND gate, an NOR gate or an NAND gate.

In practice, the invention is particularly advantageous when at least some of the inputs E of the compactor are connected to circuit outputs A of the circuit S, and are in the form of outputs of scan paths.

During the manufacture of the semiconductor circuits, it is possible for at least some items of the circuit S to be tested and, possibly, to be diagnosed, the compactor K and the error indication circuit to be components of an integrated circuit. In this case, it is also possible to arrange only parts of these components on the common semiconductor chip, if the other parts are provided externally.

A particularly time-saving manufacturing procedure is obtained by providing a memory apparatus for the data which is produced at the test data outputs. It is thus possible to test a large number of circuits, in which case the circuits which are initially assessed as being faulty on the basis of the error signal f can be withdrawn before delivery until they can be assessed in more detail. In this case, there is no need to repeat all the tests for detailed analysis, and it is sufficient to analyze the stored test results.

There is no need to describe in detail the fact that additions which relate to the simplest embodiment of the circuit arrangement according to the invention can also be applied to the compactor itself in its simplest embodiment.

In the same way, the concept of the invention is not restricted to embodiments in which the signal forms stated in the exemplary embodiments occur. It is thus possible to provide a circuit in which a syndrome which indicates that there are no errors or faults has values of "1" instead of the "0" values. In the same way, the signal f which indicates that there are no errors or faults may have the value "1".

A test arrangement according to the invention with a circuit arrangement as described above has an external tester T which produces predetermined test input values at the inputs of a circuit S, produces predetermined compensation values with a length of k bits at the compensation inputs of the compactor, and produces predetermined masking signals at any masking inputs.

The tester T, which produces predetermined test input values at the inputs of two or more identical circuits S, produces predetermined compensation values with a length of k bits at the compensation inputs of the compactors K in these circuits S, and produces predetermined masking signals at any masking inputs of these circuits allows particularly time-saving testing.

During operation, i.e., for testing or subsequent diagnosis, of an electronic circuit S having a number of circuit inputs for inputting input data or test inputs and having a total number M of circuit outputs A for emitting output data with a length M bits or test outputs, a compactor K which is also linear is provided with a total number M of test data inputs, which are connected to the circuit outputs A, and with a total number k of test comparison inputs and a total number m of test data outputs.

The linear compactor K has a number of H matrix XOR gates, which are arranged as a switching mechanism between the test data inputs and the test data outputs such that the data which is applied to its test data inputs is produced at the test data outputs compressed in accordance with the coefficients of an H matrix of a linear, error-correcting code.

The compactor K also has compensation XOR gates, which are arranged in the area between the test data inputs and the test data outputs, with one input of one compensation XOR gate being provided for inputting a compensation value (or compacted test comparison value), which is also external.

A number of test data items are then calculated as a set of mutually associated input data items or test inputs, and likewise output data or test outputs and compensation values, with the compensation values being produced in such a way that a predetermined signal pattern is produced at the test data outputs when the actual output data matches the output data to be expected.

In addition, one or more error indication circuits are provided, whose inputs are connected to at least some of the lines of the compactor K and which emit an error indication signal (f) when the signal which occurs at the test data outputs is not the same as the signal pattern which is provided for the situation in which there are no errors or faults.

Finally, the input data is applied to the circuit inputs, for testing or for diagnosis.

In a test mode, input data is applied to the circuit inputs until all of the input data has been processed, with a determination being made as to whether an error indication signal has occurred in one or more input data items.

In a test mode, input data can also be applied to the circuit inputs until an error indication signal (f) occurs. After this, the test may be stopped.

In a diagnosis mode, input data can be applied to the circuit inputs, in which an error indication signal occurs, with the data that is produced at the test data outputs being recorded and, if required, being evaluated later.

For operation of an electronic circuit according to the invention, the data which occurs at the test data inputs is stored in the area of the tested circuit, and if required is read later.

The invention also relates to a computer program which runs in a test device, for performing a method for testing an integrated circuit, which is designed such that the previous method steps can be performed. The computer program may be contained on a storage medium, in particular in a computer memory or in a direct access memory, and may be transmitted on an electrical carrier signal. In consequence, a data storage medium such as this with a computer program according to the invention also becomes part of an invention. The invention also covers a method in which a computer program is downloaded from an electronic data network, for example from the Internet, to a computer which is connected to the data network.

In contrast to the prior art, only the m bits of the syndrome of the code are required for diagnosis in the case of the invention, and not the word length M of all M outputs, m<M. The values which are required for diagnosis are compacted onto a syndrome of an error-correcting code, so that only k comparison values need be provided by the tester, with these comparison values having a length with any desired graduation from m to M, without requiring the length M bits. The diagnosis data may be stored on the chip, and X values may be dealt with in a different form. The test severity can be varied by means of k as required up to 100% (for k=M). In practical situations, m is less than 20 for M=1,000. According to the invention, the circuit diagnosis is not performed until after error identification.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is illustrated with reference a number of exemplary embodiments in the drawing.

DETAILED DESCRIPTION

Figure 1:
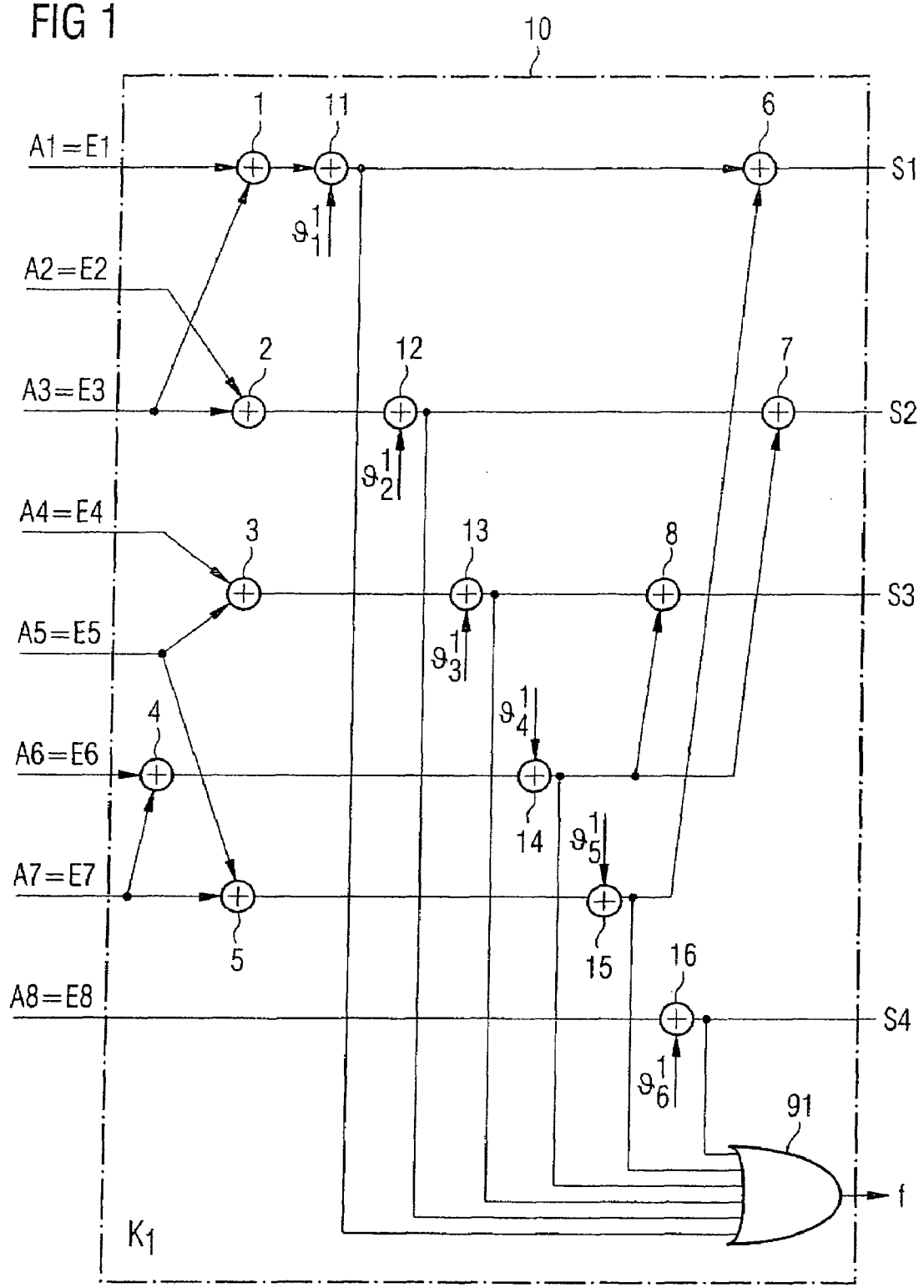
FIG. 1 shows a compactor circuit according to an exemplary embodiment of the invention.

FIG. 1 shows a compactor circuit $K_1$ 10 according to an exemplary embodiment of the invention for testing and for diagnosis of a circuit S with 8 outputs A1, A2, . . . , A8. A shortened Hamming code with the control matrix H is used as the error-correcting code, preferably a linear code, and this is also referred to as a parity checking matrix, in which:

$$H = \begin{pmatrix} 1 & 0 & 1 & 0 & 1 & 0 & 1 & 0 \\ 0 & 1 & 1 & 0 & 0 & 1 & 1 & 0 \\ 0 & 0 & 0 & 1 & 1 & 1 & 1 & 0 \\ 0 & 0 & 0 & 0 & 0 & 0 & 0 & 1 \end{pmatrix}$$

Hamming codes and shortened Hamming codes are known well to those skilled in the art and are described, for example, in Peterson, W., "Testable and correctable codes", Oldenburg Verlag, Munich and Vienna, 1967.

The compactor circuit $K_1$ has the M=8 test data inputs E1, E2, . . . , E8, the further k=6 comparison inputs $v_1^1, \ldots, v_6^1$, the m=4 syndrome output S1, S2, S3, S4 and the error signal outputs f. The outputs A1, A2, . . . , A8 of the circuit to be tested and to be diagnosed, which are not shown in FIG. 1, are connected to the corresponding test data inputs E1, E2, . . . , E8 of the compactor circuit $K_1$ 10.

The values of the syndrome output S1, S2, S3, S4 are defined by the following equation:

$$\begin{pmatrix} S1 \\ S2 \\ S3 \\ S4 \end{pmatrix} = H \begin{pmatrix} E1 \\ E2 \\ E3 \\ E4 \\ E5 \\ E6 \\ E7 \\ E8 \end{pmatrix} \oplus \begin{pmatrix} v_1^1 \oplus v_5^1 \\ v_2^1 \oplus v_4^1 \\ v_3^1 \oplus v_4^1 \\ v_6^1 \end{pmatrix}$$

The error output f is defined by the following equation:

$$f = (E1 \oplus E3 \oplus v_1^1) \vee (E2 \oplus E3 \oplus v_2^1) \vee (E4 \oplus E5 \oplus v_3^1)$$
$$\vee (E6 \oplus E7 \oplus v_4^1) \vee (E5 \oplus E7 \oplus v_5^1) \vee (E8 \oplus v_6^1)$$

The symbol $\oplus$ in this case represents an XOR logic operation on the signals which are present on the respective lines.

This results in the following components of the signatures:
$S1 = E1 \oplus E3 \oplus E5 \oplus E7 \oplus v_1^1 \oplus v_5^1$
$S2 = E2 \oplus E3 \oplus E6 \oplus E7 \oplus v_2^1 \oplus v_4^1$
$S3 = E4 \oplus E5 \oplus E6 \oplus E7 \oplus v_3^1 \oplus v_4^1$
$S4 = E8 \oplus v_6^1$ The k=6 binary comparison values $v_1^1, \ldots, v_6^1$ which are produced by the tester are defined by:
$v_1^1 = E1 \oplus E3$
$v_2^1 = E2 \oplus E3$
$v_3^1 = E4 \oplus E5$
$v_4^1 = E6 \oplus E7$
$v_5^1 = E5 \oplus E7$
$v_6^1 = E8$ As can be seen, that particular subset of the lines which are logically linked with the inputs of the OR gate 91 that is provided here as an error indication apparatus carries the value 0 when no errors or faults are present. These are the output lines of the XOR gates 11, 12, 13, 14, 15 and 16, which are compensated to form 0 by means of the comparison values produced by the tester.

The circuit shown in FIG. 1 is an integrated semiconductor circuit on a semiconductor substrate, on which the circuit S to be verified is also provided.

The circuit shown in FIG. 1 will now be described in detail. The input E1 is connected to the first input of the XOR gate 1, and its second input is connected to the input E3. The output of the XOR gate 1 is passed to the first input of the XOR gate 11. The binary comparison value $v_1^1$ of a tester, which is not shown here, is applied to the second input of the XOR gate 1, and the output of the XOR gate 1 is passed to the first input of an XOR gate 6. Its output carries the first component S1 of the syndrome or fault syndrome.

The input E2 is connected to the first input of an XOR gate 2, whose second input is connected to the input E3. Its output is passed to the first input of an XOR gate 12, and the binary comparison value $v_2^1$ which is produced by the tester is applied to its second input. The output of the XOR gate 12 is fed into the first input of an XOR gate 7, and its output carries the second component S2 of the syndrome.

The input E4 is connected to the first input of the XOR gate 3, whose second input is connected to the input E5. Its output is passed to the first input of the XOR gate 13, and the binary comparison value $v_3^1$ which is produced by the tester is applied to its second input. The output of the XOR gate 13 is passed to the first input of an XOR gate 8, and its output carries the third component S3 of the syndrome. The second input of the XOR gate 8 will be described in the following text with reference to the input E6.

The input E5 is connected to the first input of the XOR gate 5, whose second input is connected to the input E7. The output of the XOR gate 5 is passed to the first input of the XOR gate 15. The binary comparison value $v_5^1$, which is produced by the tester, is applied to its second input. The output of the XOR gate 15 is passed to the second input of the XOR gate 6.

The input E6 is connected to the first input of an XOR gate 4, whose second input is connected to the input E7. The output of the XOR gate 4 is passed to the first input of an XOR gate 14. The binary comparison value $v_4^1$ which is produced by the tester is applied to its second input. The output of the XOR gate 14 is passed to the second input of the XOR gate 7.

The input E8 is connected to the first input of an XOR gate 16, to whose second input the binary comparison value $v_6^1$ which is produced by the tester is applied. The output of the XOR gate 16 carries the fourth component S4 of the syndrome.

The output lines of the XOR gates 1, 2, 3, 4, 5 and the input line E8 are thus XOR-linked in the XOR gates 11, 12, 13, 14, 15, 16 with the values $v_1^1, \ldots, v_6^1$ which are produced by the tester.

The outputs of the XOR gates 11, 12, 13, ..., 16 carry the value "0" when there are no faults or errors, because their respective inputs are then each the same.

A subset of the lines of the compactor $K_1$, which have been compensated by the XOR gates 11, ..., 16 such that the outputs of these XOR gates continue to produce the value "0" when there are no errors or faults are linked to the inputs of an OR gate 91.

The output of the OR gate 91 produces a "1" as an error signal when at least one of its inputs is at the value "1".

It should be noted that the k=6 lines after the XOR logic operation with the comparison values $v_1^1, \ldots, v_6^1$ are at the value 0 for as long as there are no errors or faults. It should also be noted that, when these lines are each at the value 0 the m=4 outputs S1, S2, S3, S4 of the comparator $K_1$ are also each at the value 0.

The XOR gates of the compactor $K_1$ which logically link the values which are applied to its inputs in accordance with the coefficients of the H matrix of the error-correcting code under consideration, are in this case the XOR gates 1, 2, 3, 4, 5, 6, 7, and 8, and are referred to as H matrix XOR gates. The syndrome output S1 is thus linked via the XOR gates 1, 5 and 6 to the inputs E1, E3, E5 and E7 in accordance with the first row 10101010 of the H matrix. This row has the value 1 in the first, third, fifth and seventh digits. These positions correspond to the inputs which are logically linked via these H matrix XOR gates.

In a corresponding manner to the second row of the H matrix 01100110, which has a 1 at the positions 2, 3, 6 and 7, the inputs E2, E3, E6 and E7 are logically linked to the syndrome output S2 via the H matrix XOR gates 2, 4 and 7.

In a corresponding manner to the third row of the H matrix 00011110, which has a 1 in the positions 4, 5, 6 and 7, the inputs e4, e5, e6 and e7 are logically linked to the syndrome output S3 via the H matrix XOR gates 3, 4 and 8.

The fourth row of the H matrix 00000001 has the value 1 only in the eighth digit, and the input E8 is connected to the syndrome output S4 without any need for XOR logic linking of this eighth input to a further input.

The further XOR gates 11, 12, 13, 14, 15 and 16 are compensation XOR gates. Corresponding comparison values, which are produced by the tester, are applied to their respective second inputs.

The method of operation of the compactor $K_1$ for testing and for diagnosis will now be explained for various data items to be processed. The values which are produced by the tester are referred to for the sake of simplicity in the following text by v1 to v6. The XOR symbol $\oplus$ is referred to for the sake of simplicity in the following text by "XOR".

At a first time t under consideration, it is assumed that the circuit to be tested and to be diagnosed will emit the correct response to a corresponding test symbol, for example with: A1=1, A2=1, A3=0, A4=1, A5=0, A6=0, A7=0, A8=1. The outputs Ai are connected to the inputs E1 for i=1, ..., 8 such that the values E1=1, E2=1, E3=0, E4=1, E5=0, E6=0, E7=0, E8=1) are applied to the inputs of the compactor. The value E1$\oplus$E3=1$\oplus$0=1 is formed at the output of the XOR gate 1, and is applied to the first input of the XOR gate 11. The value v1=1 must therefore be applied to the second input of the XOR gate 11 in order to produce the value 0 at the output of the XOR gate 11. This value v1=1 is produced by the external tester at this time t. The value E2 XOR E3=1 XOR 0=1 is formed at the output of the XOR gate 2 and is applied to the first input of the XOR gate 12. The value v2=1 must therefore be applied to the second input of the XOR gate 12 in order to produce the value 0 at the output of the XOR gate 12. This value v2=1 is produced by the external tester at this time t. The value E4 XOR E5=1 XOR 0=1 is formed at the output of the XOR gate 3 and is applied to the first input of the XOR gate 13. The value v3=1 must therefore be applied to the second input of the XOR gate 13 in order to produce the value 0 at the output of the XOR gate 13. This value v3=1 is produced by the external tester at this time t. The value E6 XOR E7=0 XOR 0=0 is formed at the output of the XOR gate 4 and is applied to the first input of the XOR gate 14. The value v4=0 must therefore be applied to the second input of the XOR gate 14 in order to produce the value 0 at the output of the XOR gate 14. This value v1=0 is produced by the external tester at this time t. The value E5 XOR E7=0 XOR 0=0 is formed at the output of the XOR gate 5 and is applied to the first input of the XOR gate 15. The value v5=0 must therefore be applied to the second input of the XOR gate 15 in order to produce the value 0 at the output of the XOR gate 15. This value v5=0 is produced by the external tester at this time t. The value v6=1 must be produced by the external tester at the second input of this XOR gate 16 in order to produce the value 0 at the output of this XOR gate 16 in order that the value E8=1 which is applied to its first input is logically linked to 1 XOR 1=0. The outputs of the XOR gates 11, 12, 13, 14, 15, 16 which are connected to the inputs of the OR gate 91 now all each carry the value 0, so that the error signal f is equal to 0, as a consequence to which no error is indicated. It should be noted that all of the components S1, S2, S3 and S4 of the syndrome are also equal to 0 since 0 XOR 0=0 is formed in each of the XOR gates 6, 7 and 8, and 1 XOR 1=0 is formed in the XOR gate 16.

In a second case, the incorrect value A1=1, A2=1, A3=0, A4=1, A5=0, A6'=1, A7=0, A8=1 is emitted at the time t from the circuit to be tested and to be diagnosed. This means that A6'=1 is now incorrectly emitted, instead of the correct value A6=0. None of the other values should be changed in comparison to the first time. The value E6' XOR E7=1 XOR 0=1 is formed at the output of the XOR gate 4 and is applied to the first input of the XOR gate 14. The value v4=0, which is produced by the external tester, is now applied to the second input of the XOR gate 14. The value 1 XOR 0=1 is thus produced at the output of the XOR gate 14, and is passed to the third input of the OR gate 91, so that the error signal f assumes the value 1. The output of the XOR gate 14 carries the value 1, and passes this value to each of the second inputs of the XOR gates 7 and 8. The values 0 are applied to each of their first inputs. The syndrome outputs S2 and S3 of the compactor K, now each carry the value 1. The error signal f=1 indicates an error, and the values of the components of the syndrome S1, S2, S3, S4 can now be evaluated for error determination. The compactor K, under consideration uses a shortened Hamming code, i.e., the vector (S1 S2 S3 S4)=(0 1 1 0), in a binary form, thus directly indicates that the input E6 of the compactor $K_1$, and thus the output A6 of the circuit to be tested and to be diagnosed, was faulty. The characteristics of this code are known to those skilled in the art.

The invention in this case allows numerous circuits to be tested in a first step, the testing process, to determine whether they exhibit any fault at all during the test. To do this, it is sufficient to monitor the fault output f. The sound circuits can still be used. In the case of the circuits that are identified during testing as being faulty, the diagnosis steps mentioned above are then used to evaluate the resultant syndromes. To this extent, a distinction is thus drawn between testing and diagnosis, even though the same circuit is verified both times.

Figure 2:
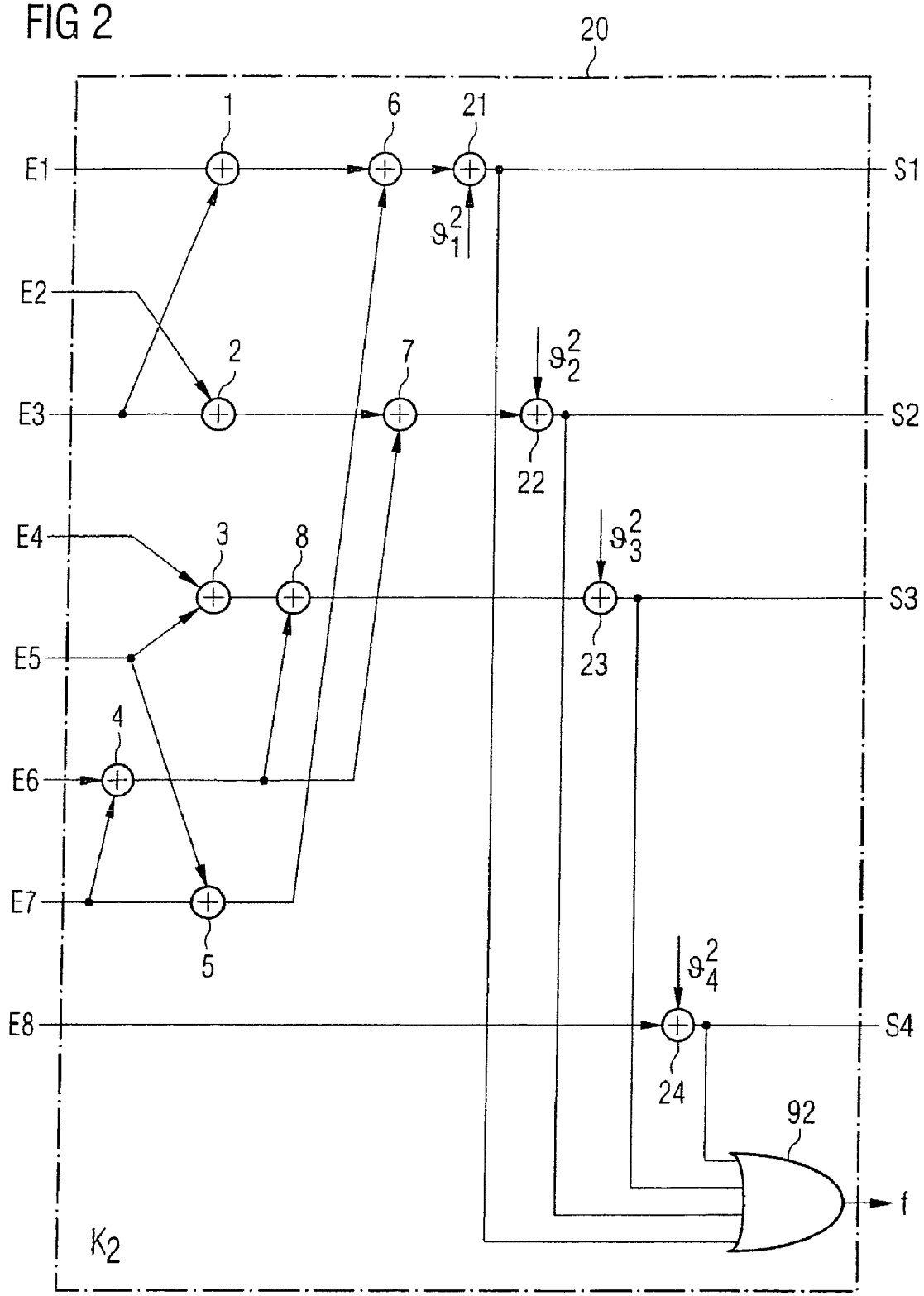
FIG. 2 shows a further compactor circuit according to an exemplary embodiment of the invention.

FIG. 2 shows a further compactor circuit $K_2$ 20 according to another exemplary embodiment of the invention. The same shortened Hamming code with the control matrix H described in connection with the compactor $K_1$ 10 shown in FIG. 1 will be used as the error-correcting code in the embodiment shown in FIG. 2 as well. The compactor circuit $K_2$ has M=8 test data inputs E1, E2, ..., E8, the further k=4 comparison inputs $v_1^2, \ldots, v_4^2$, the m=4 syndrome outputs S1, S2, S3, S4, and the error signal output f. For the sake of simplicity, the comparison inputs $v_1^2, \ldots, v_4^2$ are referred to in the following text as v1, ..., v4. The outputs A1, A2, ..., A8 of the circuit to be tested and to be diagnosed, which is not shown in FIG. 2, are connected to the corresponding test data inputs E1, E2, ..., E8 of the compactor circuit $K_2$ 20.

The values of the syndrome outputs S1, S2, S3, S4 are defined by the equation:

$$\begin{pmatrix} S1 \\ S2 \\ S3 \\ S4 \end{pmatrix} = H \begin{pmatrix} E1 \\ E2 \\ E3 \\ E4 \\ E5 \\ E6 \\ E7 \\ E8 \end{pmatrix} \oplus \begin{pmatrix} v_1^2 \\ v_2^2 \\ v_3^2 \\ v_4^2 \end{pmatrix}$$

The error output is governed by the equation $f=(E1\oplus E3\oplus E5\oplus E7\oplus v_1^2)\vee(E2\oplus E3\oplus E6\oplus E7\oplus v_2^2)$
$\vee(E4\oplus E5\oplus E6\oplus E7\oplus v_3^2)\vee(E8\oplus v_4^2)$ The components of the signatures are obtained directly from the above equation, as:
S1=E1⊕E3⊕E5⊕E7⊕$v_1^2$
S2=E2⊕E3⊕E6⊕E7⊕$v_2^2$
S3=E4⊕E5⊕E6⊕E7⊕$v_3^2$
S4=E8⊕$v_4^2$ The XOR symbol ⊕ is referred to, for the sake of simplicity, in the following text as "XOR".

The k=4 binary comparison values v1, ..., v4 which are produced by the tester are defined for the correct values E1, ..., E8 by
v1=E1 XOR E3 XOR E5 XOR E7,
v2=E2 XOR E3 XOR E6 XOR E7,
v3=E4 XOR E5 XOR E6 XOR E7,
v4=E8.

The circuit shown in FIG. 2 will now be described in detail. The gates in FIG. 2, which functionally correspond to the gates in FIG. 1, are annotated with the same reference symbols in FIG. 2, in order to assist understanding.

The input E1 is connected to the first input of the XOR gate 1, whose second input is connected to the input E3. The input E2 is connected to the first input of the XOR gate 2, whose second input is connected to the input E3. The input E4 is connected to the first input of the XOR gate 3, whose second input is connected to the input E5, which is at the same time likewise connected to the first input of the XOR gate 5, and its second input is connected to the input E7, which is at the same time connected to the second input of the XOR gate 5, to whose first input the input E6 is connected. The output of the XOR gate 1 is connected to the first input of the XOR gate 6, whose second input is connected to the output of the XOR gate 5. The output of the XOR gate 2 is connected to the first input of the XOR gate 7, whose second input is connected to the output of the XOR gate 4. The output of the XOR gate 3 is connected to the first input of the XOR gate 8, whose second input is connected to the output of the XOR gate 4. The output of the XOR gate 6 is connected to the first input of the XOR gate 21, to whose second input the binary signal v1, which is produced by the tester, is applied. The output of the XOR gate 21, which carries the first component S1 of the syndrome, is connected to the fourth input of the OR gate 92. The output of the XOR gate 7 is connected to the first input of the XOR gate 22, to whose second input the binary signal v2, which is produced by the tester, is applied. The output of the XOR gate 23, which carries the second component S2 of the syndrome, is connected to the third input of the OR gate 92. The output of the XOR gate 8 is connected to the first input of the XOR gate 23, to whose second input the binary signal v3, which is produced by the tester, is applied. The output of the XOR gate 23, which carries the third component S3 of the syndrome, is connected to the second input of the OR gate 92.

The input E8 is connected to the first input of the XOR gate 24, to whose second input the binary signal v4, which is produced by the tester, is applied. The output of the XOR gate 24, which carries the fourth component S4 of the syndrome, is connected to the first input of the OR gate 92. The output of the OR gate 92 carries the error signal f.

It should be noted that k=m=4, i.e., the word length or the number of comparison signals which are produced by the tester is equal to the number of components of the syndrome or to the outputs of the compactor 20. In this context, it is also occasionally stated, for short, that the number of syndromes is equal to 4. The subset of the lines of the compactor K which each carry the value 0 when no errors are present and which are logically linked to the inputs of the OR gate are in this case formed by the output lines of the XOR gates 21, 22, 23, and 24.

The number of comparison signals which are produced by the tester is less in the case of FIG. 2 than in the case of FIG. 1. A simpler tester can therefore be used. However, it is accepted that more errors or faults will remain unidentified, in comparison.

The method of operation of the compactor $K_2$ 20 for testing and for diagnosis will now be explained for the same data as for the compactor $K_1$, in order to illustrate the relationship between the number of comparison signals which are produced by the tester—which in this case is chosen to be less than in FIG. 1—and the probability of an error not being identified as such. The XOR symbol ⊕ is referred to, for the sake of simplicity, in the following text as "XOR".

The correct output from the circuit to be tested and to be diagnosed as the response to a corresponding test input is once again assumed to be A1=1, A2=1, A3=0, A4=1, A5=0, A6=0, A7=0, A8=1 at the time t under consideration. The outputs Ai of the circuit S are connected to the inputs E1 of the compactor 20 for i=1, ..., 8, so that the values E1=1, E2=1, E3=0, E4=1, E5=0, E6=0, E7=0, E8=1 are applied to the inputs of the compactor. The value E1 XOR E3=1 XOR 0=1 is formed at the output of the XOR gate 1. The value E2 XOR E3=1 XOR 0=1 is formed at the output of the XOR gate 2. The value E4 XOR E5=1 XOR 0=1 is formed at the output of the XOR gate 3. The value E6 XOR E7=0 XOR 0=0 is formed at the output of the XOR gate 4. The value E5 XOR E7=0 XOR 0=0 is formed at the output of the XOR gate 5. The value 1 XOR 0=1 is formed at the output of the XOR gate 6, and is applied to the first input of the XOR gate 21. The binary value v1=1, which is produced by the tester, must be applied to the second input of the XOR gate 21, in order to produce the value 0 at the output of this gate.

The value 1 XOR 0=1 is formed at the output of the XOR gate 7, and is applied to the first input of the XOR gate 22. The binary value v2=1, which is produced by the tester, must be applied to the second input of the XOR gate 22, in order to produce the value 0 at the output of this gate.

The value 1 XOR 0=1 is formed at the output of the XOR gate 8, and is applied to the first input of the XOR gate 23. The binary value v3=1, which is produced by the tester, must be applied to the second input of the XOR gate 23, in order to produce the value 0 at the output of this gate.

The value E8=1 is applied to the input of the XOR gate 24. The binary value v4=1, which is produced by the tester, must be applied to the second input of the XOR gate 24, in order to produce the value 0 at the output of this gate. It should be noted that all of the components S1, S2, S3 and S4 of the syndrome are now equal to 0.

In the case of the compactor $K_1$, we now assume that the circuit to be tested and to be diagnosed emits the incorrect value A1=1, A2=1, A3=0, A4=1, A5=0, A6'=1, A7=0, A8=1 at the time t. A6'=1 is now incorrectly emitted, instead of the correct value A6=0. All the other values should remain unchanged. The values which are emitted from the XOR gates 1, 2, 3, 5, 6, 21 and 24 remain unchanged and equal to 1, 1, 1, 0, 0 and 0. The values which are emitted from the XOR gates 4, 7, 8, 22 and 23 are now 1, 0, 0, 1 and 1, and the error signal f=1 indicates an error. If the outputs of the compactor K are now evaluated, then the vector (S1 S2 S3 S4)=(0 1 1 0) in binary form now indicates directly that the input E6 of the compactor K, and thus the output A6 of the circuit to be tested and to be diagnosed, were faulty.

Specifically, the Hamming code is used in the compactor according to the invention in such a way that its outputs in binary form indicate directly the input at which an error has occurred. It thus emits, from left to right, as the binary number 0 1 1 0 (=0+4+2+0=6), the order number 6, which corresponds to the input.

If, by way of example, the input values of the inputs E1, E6 and E7 of the compactor 10 are incorrect at the same time in the circuit shown in FIG. 1, then the output of the XOR gate 1 and the output of the XOR gate 5 are incorrect.

The incorrect outputs of these XOR gates are then not compensated for by the comparison values v1 and v5, which are produced by the tester, for inputting into the XOR gates 11 and 15, so that the value 1 occurs at the output of these gates, and the OR gate 91 indicates an error.

If, in contrast, the input values of the same inputs E1, E6 and E7 of the compactor $K_2$ 20 in FIG. 2 are incorrect at the same time, then these three errors in the input values in the XOR gates 4 and 6 are compensated for. The values which are then applied to each of the first inputs of the XOR gates 21, 22, 23 and 24 then all appear to be correct. The XOR logic operation with the comparison values v1, v2, v3, v4 which are produced by the tester and are applied to the respective second inputs of these XOR gates thus in each case result in the value 0 at the outputs of these XOR gates 21, 22, 23 and 24. Since the outputs of the XOR gates 21, 22, 23 and 24 carry the value 0 to the inputs of the OR gate 92 and to all of these outputs, f=0, and no error signal is emitted, even though an error is present.

As can be seen from the last example, some so-called "multiple errors or faults" cannot be identified as being erroneous when only four comparison signals are produced by the tester, rather than six comparison signals as in FIG. 1. The complexity for implementation of the test is then, however, correspondingly less. In practice, the probability of non-identification of multiple errors and faults is relatively low. The error identification restriction associated with this may be accepted, according to the invention.

Figure 3:
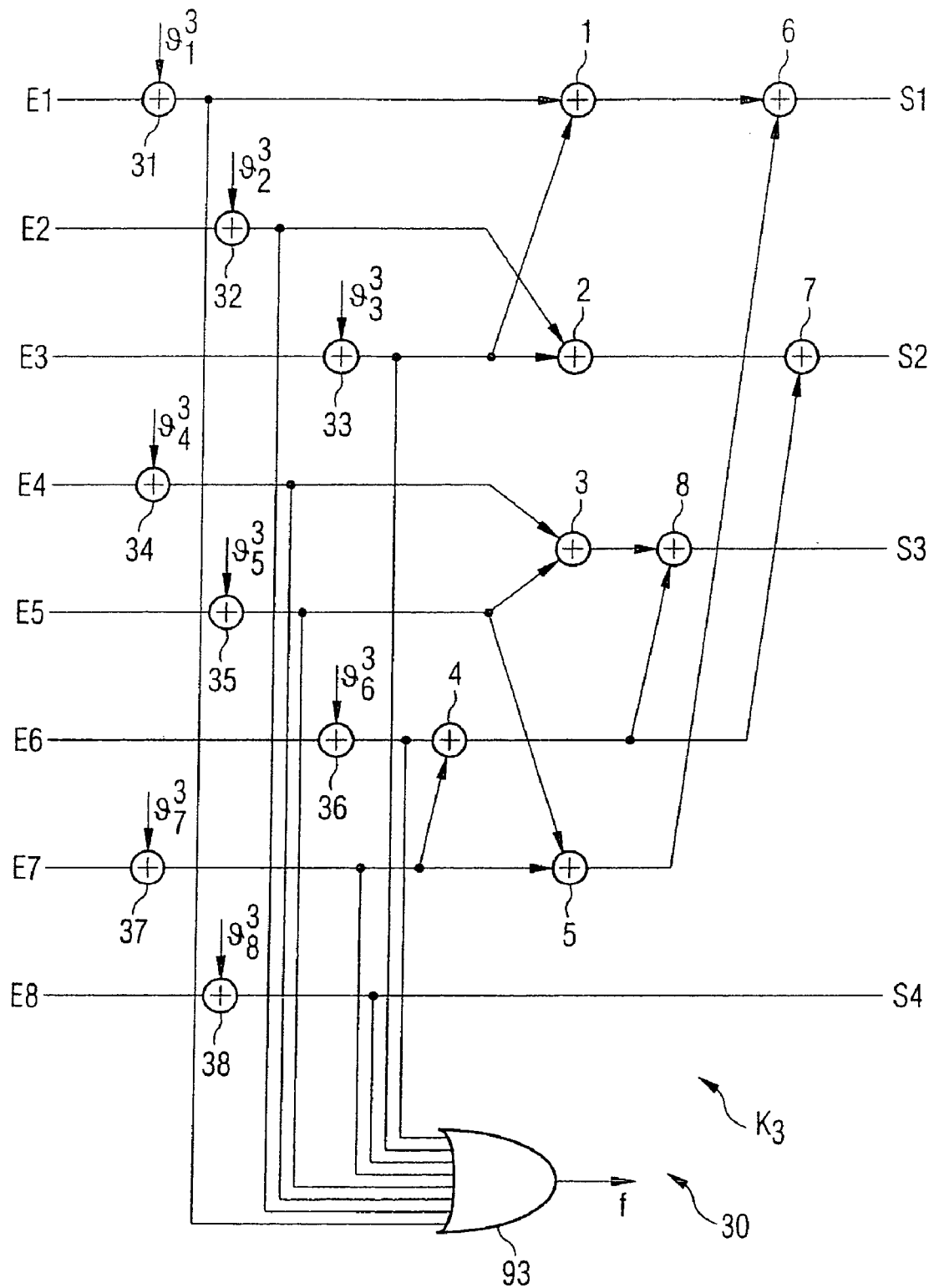
FIG. 3 shows a further compactor circuit according to an exemplary embodiment of the invention.

FIG. 3 shows a further compactor circuit $K_3$ 30 according to the invention. The same shortened Hamming code with the same monitoring matrix is used as the error-correcting code, as for the compactor K, 10 in FIG. 1 and for the compactor $K_2$ in FIG. 2. The compactor circuit K 30 has M=8 test data inputs E1, E2, ..., E8, k=M=8 further comparison inputs $v_1^3, \ldots, v_8^3$, m=4 syndrome outputs S1, S2, S3, S4 and an error signal output f. The comparison inputs $v_1^3, \ldots, v_8^3$ are referred to for short in the following text as v1, v2, ..., v8. The outputs A1, A2, ..., A8 of the circuit which is not shown but is to be tested and to be diagnosed are connected to the corresponding test data inputs E1, E2, ..., E8 of the compactor circuit $K_3$ 30.

The symbol $\oplus$ which is used for the XOR logic operation is referred to in the following text, for the sake of simplicity, as "XOR".

The components of the syndrome or for the syndromes are now:

S1=E1 XOR E3 XOR E5 XOR E7 XOR v1 XOR v3 XOR v5 XOR v7

S2=E2 XOR E3 XOR E6 XOR E7 XOR v2 XOR v3 XOR v6 XOR v7

S3=E4 XOR E5 XOR E6 XOR E7 XOR v4 XOR v5 XOR v6 XOR v7

S4=E8 XOR v8

The k=8 binary comparison values v1, ..., v8 which are produced by the tester were defined before the evaluation of the circuit was performed such that no errors or faults are indicated at the syndrome output S1 to S4 or at the error signal output f when the correct values are present at the inputs E1, ..., E8 for i=1, ..., 8.

The error output is governed by the equation f=(E1 XOR v1)V(E2 XOR v2)V(E3 XOR v3)V(E4 XOR v4)V(E5 XOR v5)V(E6 XOR v6) V(E7 XOR v7)V(E8 XOR v8)

In this case, the symbol "V" represents a logic or operation "OR".

The circuit shown in FIG. 3 will now be described in detail. The gates in FIG. 3, which correspond functionally to the gates in FIGS. 1 and 2, have been marked with the same reference symbols in FIG. 3 in order to assist understanding.

FIG. 3 in this case shows that the comparison signals v 1, ..., v8 which are produced by the tester can also be directly logically linked at the compactor inputs with the input signals E1, ..., E8 which are applied there, when the idea on which the invention is based is used.

The input E1 is connected to the first input of the XOR gate 31, to whose second input the comparison signal v1, which is produced by the tester, is applied and whose output is passed to the first input of the XOR gate 1 and to the eighth input of the OR gate 93. The input E2 is connected to the first input of the XOR gate 32, to whose second input the comparison signal v2, which is produced by the tester, is applied, and whose output is passed to the first input of the XOR gate 2 and to the seventh input of the OR gate 93. The input E3 is connected to the first input of the XOR gate 33, to whose second input the comparison signal v3, which is produced by the tester, is applied and whose output is passed to the second input of the XOR gate 1, to the second input of the XOR gate 2 and to the sixth input of the OR gate 93. The input E4 is connected to the first input of the XOR gate 34, to whose second input the comparison signal v4, which is produced by the tester, is applied and whose output is passed to the first input of the XOR gate 3 and to the fifth input of the OR gate 93. The input E5 is connected to the first input of the XOR gate 35, to whose second input the comparison signal v5, which is produced by the tester, is applied and whose output is passed to the second input of the XOR gate 3, to the first input of the XOR gate 5 and to the fourth input of the OR gate 93. The input E6 is connected to the first input of the XOR gate 36, to whose second input the comparison signal v6, which is produced by the tester, is applied, and whose output is passed to the first input of the XOR gate 4 and to the third input of the OR gate 93. The input E7 is connected to the first input of the XOR gate 37, to whose second input the comparison signal v7, which is produced by the tester, is applied and whose output is passed to the second input of the XOR gate 4, to the second input of the XOR gate 5 and to the second input of the OR gate 93. The input E8 is connected to the first input of the XOR gate 38, to whose second input the comparison signal v8, which is produced by the tester, is applied, whose output is connected to that output of the comparator which carries the fourth component S4 of the syndrome, and is passed to the first input of the OR gate 93.

The subset of those lines which carry the value 0 when there is no error and which are logically linked to the inputs of the OR gate 93 are formed in FIG. 3 by the output lines of the XOR gates 31, 32, 33, 34, 35, 36, 37, and 38.

The output of the XOR gate 1 is connected to the first input of the XOR gate 6, whose second input is connected to the output of the XOR gate 5. The output of the XOR gate 2 is connected to the first input of the XOR gate 7, whose second input is connected to the output of the XOR gate 4. The output of the XOR gate 3 is connected to the first input of the XOR gate 8, whose second input is connected to the output of the XOR gate 4. The outputs of the XOR gates 6, 7 and 8 are connected to those outputs of the compactor which carry the components S1, S2 and S3. The output of the OR gate 93 carries the error signal f.

It should be noted that k=M=8. This arrangement ensures that any error in the output of the circuit to be tested and to be diagnosed can be identified, although this must be paid for by a tester which is more complex than that in FIG. 1 and FIG. 2, with eight comparison signals. Specifically, and in contrast to FIG. 1 and FIG. 2, one comparison value from the tester must be produced at each output of the circuit S, which may involve a high degree of complexity, in fact, for the circuits mentioned initially.

The method of operation of the compactor $K_3$ 30 for test and for diagnosis will now be explained for the same data as for the compactor $K_1$.

It is assumed that the circuit to be tested and to be diagnosed once again correctly emits as the response to a corresponding test input A1=1, A2=1, A3=0, A4=1, A5=0, A6=0, A7=0, A8=1 at a time t under consideration. The outputs Ai are connected to the inputs E1 for i=1, ..., 8, so that the values E1=1, E2=1, E3=0, E4=1, E5=0, E6=0, E7=0, E8=1 are applied to the inputs of the compactor. Since Ei=vi for i=1, ..., 8, then v1=1, v2=1, v3=0, v4=1, v5=0, v6=0, v7=0, v8=1, and the value 0 is emitted at the outputs of XOR gates 31, 32, 33, 34, 35, 36, 37, 38, as at the outputs of all the other XOR gates. The error signal as well as the components S1, S2, S3 and S4 of the syndrome are 0.

In the case of the compactor $K_1$, we now assume that the circuit to be tested and to be diagnosed emits the incorrect value A1=1, A2=1, A3=0, A4=1, A5=0, A6'=1, A7=0, A8=1 at the time t. A6'=1 is thus now incorrectly emitted, instead of the correct value A6=0. All the other values should remain unchanged. Since the value A6'=1 is now applied to the first input of the XOR gate 36, and the value v6=0, which is produced by the tester, is applied to the second input of this gate, the XOR gate 36 emits the value 1, while the XOR gates 31, 32, 33, 34, 35, 37 and 38 each emit the value 0. Since the value 1 is now applied to the third input of the OR gate 93, this gate now emits the error value f=1. Since the output of the XOR gate 36 is connected via the XOR gates 4 and 8 to that output of the compactor which carries the component S3, and via the XOR gates 4 and 7 to that output of the compactor which carries the component S2, and is not connected to the outputs which carry the components S1 and S4, the error syndrome is the same (S1, S2, S3, S4)=(0, 1, 1, 0), thus indicating directly, in a binary-coded form (=decimal "6") that the signal is incorrect at the input E6 to which the output A6 of the circuit to be tested and to be diagnosed is connected.

It should be noted that, in the situation where the tester produces a comparison value v1, ..., v8 for each input of the compactor E1, ..., E8, any possible error can be indicated in the error signal f, even errors or faults which cannot be indicated by the compactors described above. The errors which can be corrected by the code can be located on the basis of the error syndrome of the code under consideration, in this case the shortened Hamming code under consideration. For a Hamming code, these are known to be 1-bit errors. Other error-correcting codes can also be used in a completely analogous manner simply by replacing the H matrix H, as used for FIG. 1, FIG. 2 and FIG. 3, by the H matrix for the chosen code. The fire codes and BCH codes, with which those skilled in the art are highly familiar, may be used as examples. The use of specific linear error-correcting code is likewise the subject matter of the invention. Codes such as these, as may be used here, are described, by way of example, in the "Peterson" reference cited above.

It should be noted that the compensation for the test responses from the circuit to be tested or to be diagnosed by the values v which are produced by the tester to produce the value "0" can be performed at various points in the compactor. If the input lines E of the compactor are compensated, the values v which are produced by the tester need to have a long word length M. If, in contrast, the values are compensated at the output S, then, in contrast, a word length of only m is required for the vector v, where m<M although it is necessary to accept that certain types of errors cannot be detected. Compensation on internal lines of the compactor K, as is described in FIG. 1, is also likewise possible, in which case it is necessary to accept a compromise between the complexity for provision of the values v and the errors or faults which cannot be detected.

The complexity which results from the word length v in this case governs the accuracy or the probability with which any error in the test responses of the circuit S will be identified at the output f. It is therefore necessary to make a tradeoff during design of the compactor as to what complexity and what error identification probability one wishes to accept. This governs both the number and the arrangement of the compensation XOR gates into which the values v are entered.

On the basis of this decision, the compactor K is designed as follows in order to arrange the compensation XOR gates.

First, the H matrix XOR gates are set in accordance with the H matrix. The i-th row of the H matrix is considered in order to form the i-th syndrome output Si, i=1, ..., m. The positions of the i-th rows in the H matrix H which assume the value 1 govern the test data inputs of the compactor, which are logically linked by the H matrix XOR gates to the syndrome output Si, when the i-th row of the H matrix contains at least 2 ones.

If the i-th row in the H matrix contains only one one, for example at the j-th position, then the test data input Ej can be connected to the syndrome output Si.

The first row of the H matrix for the compactors which are illustrated in FIGS. 1-3, is 10101010. Since the first, third, fifth and seventh positions in this row are equal to 1, the test data inputs E1, E3, E5 and E7 are logically linked by the H matrix XOR gates 1, 5 and 6 to the syndrome output S1.

The second row in the H matrix is 01100110. Since the second, third, sixth and seventh positions in this row are equal to 1, the test data inputs E2, E3, E6 and E7 are logically linked by the H matrix XOR gates 2, 4 and 7 to the syndrome output S2.

The third row in the H matrix is 00011110. Since the fourth, fifth, sixth and seventh positions in this row are equal to 1, the test data inputs E4, E5, E6 and E7 are logically linked by the H matrix XOR gates 3, 4, and 8 to the syndrome output S3.

The fourth row in the H matrix is 00000001. Since only the eighth position in this row is equal to 1 in this case, only the test data input E8 is used to form the syndrome output S4.

The H matrix gates are set in accordance with the elements of the H matrix. An H matrix gate must be arranged whenever there is a "1" in the H matrix. The number of rows in the H matrix corresponds to the number of syndrome outputs S, and the number of columns corresponds to the number of inputs E. The syndrome outputs, the H matrix and the inputs E are related in accordance with the vector equation A=H*E.

In each case one compensation XOR gate may be arranged only at all of the outputs S, but is then not possible to identify all errors and faults. The compensation XOR gates can also be arranged at all of the inputs E. However, this is then very complex. With the application of a compactor according to the invention, this results in the advantage that it is necessary to store only the error bits corresponding to the number of outputs of the compactor and not to all the outputs A of the circuit S. Only the syndrome bits in the syndrome S need be considered for evaluation of the errors or faults, and not all of the bits of the inputs E and at the outputs A.

It is also possible to use intermediate variations if one wishes to achieve a good average value between complexity and error identification probability.

The compensation XOR gates should be installed in such a way that the XOR gates produce the syndrome values "0 . . . 0" when no errors are present. This can be achieved either by varying their position on a trial and error basis, or else by using the following procedure.

1. A section is defined through the wiring of the compactor without any compensation XOR gates, to be precise at any desired point; and 2. A compensation XOR gate is installed at all the interfaces such that one input of the respective compensation XOR gate is located in the signal flow towards the input E of the compactor and such that the output of the respective compensation XOR gate is located towards the output S of the compactor in the signal flow. The other input of the XOR gate has a compensation signal v applied to it, with the correct compensation signals being determined by previous simulation. This does not involve major complexity, because all of the signals required for testing or diagnosis are determined in advance by simulation.

This section is placed through the following lines in FIG. 1: output line from the XOR gate 1, output line from the XOR gate 2, output line from the XOR gate 3, output line from the XOR gate 4, output line from the XOR gate 5, and the line which is connected to the input E8. The corresponding compensation XOR gates are then the XOR gates 11, 12, 13, 14, 15, and 16.

In FIG. 2, this section is placed through the following lines: output line of the XOR gate 6, output line of the XOR gate 7, output line of the XOR gate 8, and the line which is connected to the input E8. The corresponding compensation XOR gates are then the XOR gates 21, 22, 23, and 24.

In FIG. 3, this section is placed through the lines which are connected to the inputs E1, E2, E3, E4, E5, E6, E7, and E8. The corresponding compensation XOR gates are then the XOR gates 31, 32, 33, 34, 35, 36, 37, and 38.

During testing of the circuit S, all that is checked during one test step is whether the value for f is equal to "0" for each individual test, that is to say application of a test signal and checking on the basis of the compacted output signal to be expected. If this is true for all the test steps, the circuit S is regarded as being free of faults, and the next circuit can be tested.

If this is not the case, that is to say if f indicates a fault by means of a signal "1", the syndrome values which occur in this case are evaluated in order to diagnose the fault. The fault cause can then be determined easily and accurately by using the code characteristics from the small number of syndrome values S to deduce those input values E which are incorrect.

This results in a speed advantage and considerably reduces the test complexity since only the values of the smaller number of syndrome values S are required for evaluation of an error, in comparison to the values of the large number of circuit outputs A.

In practice, it can be assumed that, in the best case, only 10 syndrome values need be evaluated for 1,000 circuit outputs, if a Hamming code is used which reliably allows all individual errors and faults to be diagnosed. However, the compacting which is performed by the code characteristics means that it may be necessary to accept lack of clarity such that a relatively small number of errors or faults cannot be identified during the test, or cannot be diagnosed in the diagnosis process. In practice, this proportion is negligible, in particular in the case of error identification.

Figure 4:
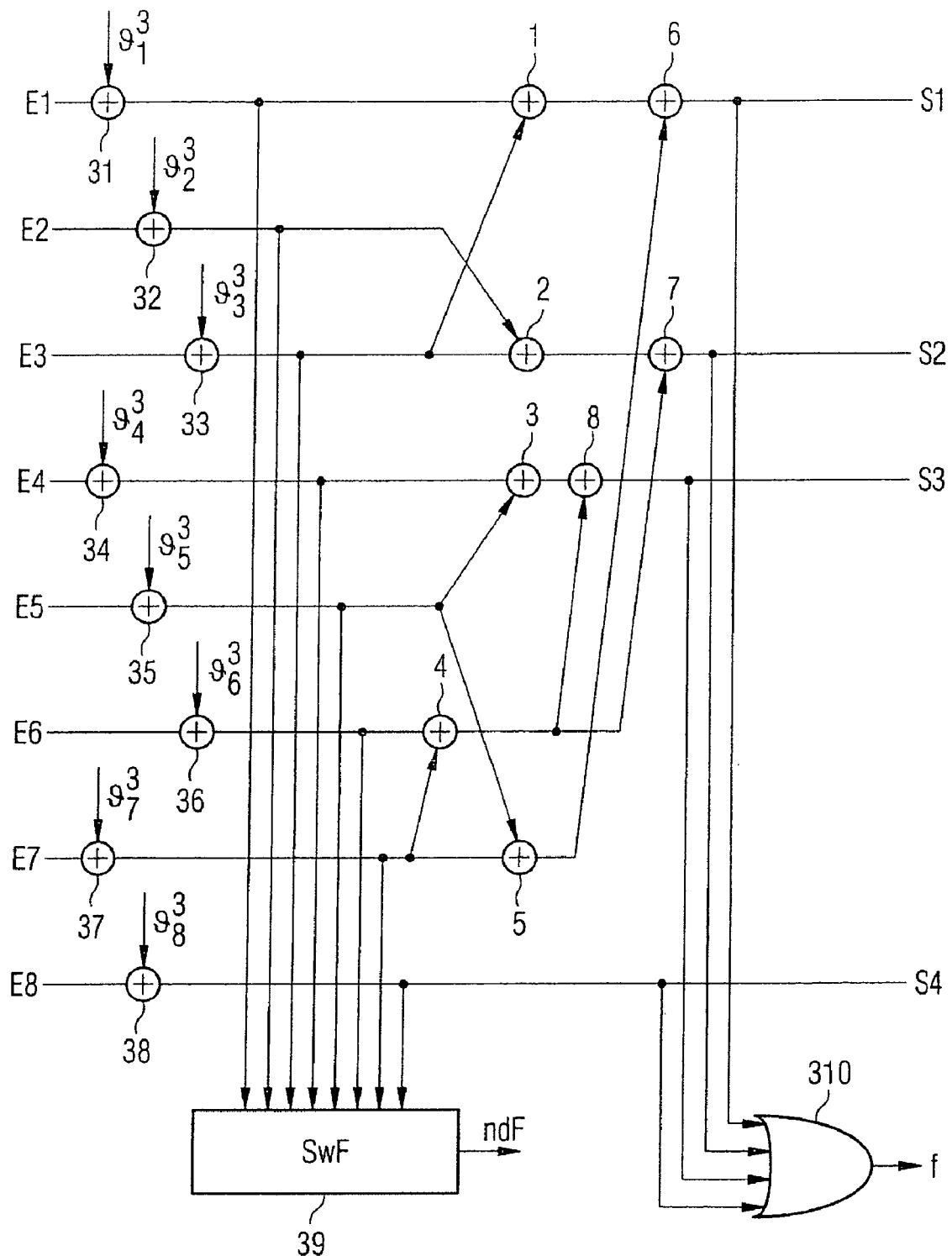
FIG. 4 shows a further compactor circuit according to an exemplary embodiment of the invention.

FIG. 4 differs from FIG. 3 in that the element 93 which is used there has provided a Boolean function OR and has the combinational circuit SwF (threshold value function) 39 added to it. The combinational circuit SwF emits a binary value ndF=1 (error which cannot be diagnosed) when the number of ones at its inputs exceeds a threshold value SW. The other elements in FIG. 4, which correspond to the elements of the circuit in FIG. 3, are annotated with the same reference symbols as in FIG. 3, and will now be described once again here.

If a shortened Hamming code is used, as in FIG. 4, then all of the one bit errors or faults at the outputs of the circuit S1, S2, S3 and S4 which emit the fault syndrome for the fault that is present are correctly diagnosed as faults at the inputs of the circuit, as has already been described above.

If there is now an error in two or more bits at the circuit inputs of the circuit in FIG. 4, i.e., there is more than one error at the inputs E1, . . . , E8, then an error such as this cannot be correctly diagnosed by means of a Hamming code, even though a syndrome value not equal to 0,0,0,0 is emitted at the outputs S1, S2, S3, S4.

For a Hamming code, the combinational circuit SwF produces the Boolean function $$ndf = \begin{cases} 1 \text{ when } \sum_i E_i \oplus v_i^3 \geq 2 \\ 0 \text{ when } \sum_i E_i \oplus v_i^3 < 2 \end{cases}$$

As can be seen, a binary value 1 is emitted at the output ndF of the combinational circuit SwF 39 when, after the component-by-component XOR logic linking of the values which are applied to the inputs E1, ..., E8 with the values v2, ..., v8 which are produced by the tester, at least two ones are present, which are applied to the inputs of the circuit SwF 39 and the Hamming code under consideration is not sufficient to diagnose an error in two or more bits correctly on the basis of its syndrome. Diagnosis thus fails, and different tests must be used for very rare situations such as these. The important factor in this case is that it is known that no error has been diagnosed incorrectly.

The output lines of the circuit in FIG. 4 which carry the syndrome values S1, S2, S3, S4 are passed to an OR gate 310, which emits an error signal f when a syndrome value not equal to 0,0,0,0 is present.

Figure 5:
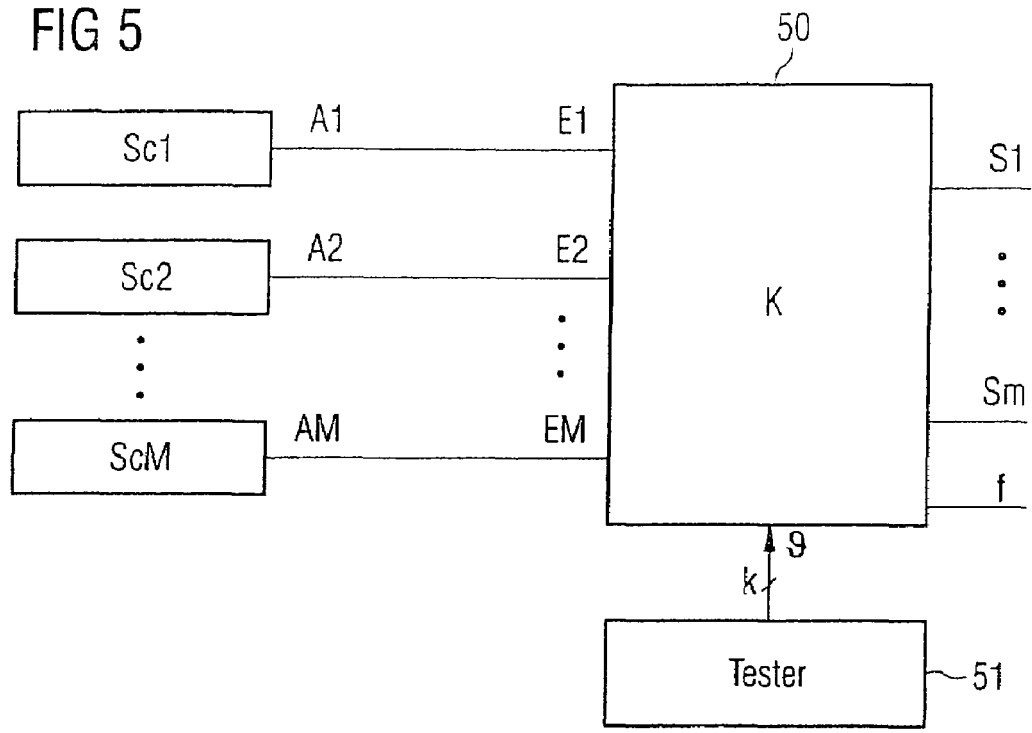
FIG. 5 shows a further compactor circuit according to t an exemplary embodiment of he invention, together with a circuit to be tested and to be diagnosed, and which has scan paths.

FIG. 5 shows that the outputs of the circuit S to be tested and/or to be diagnosed may also be outputs of scan paths of this circuit. Scan paths are known to a person skilled in the art during testing. They allow the test data to be shirted in and out during testing.

Scan paths are described, by way of example, by Abramovici et al. in "Digital Systems Testing and Testable Design," Computer Science Press, 1990.

Outputs A1, A2, ..., AM of the scan paths Sc1, Sc2, ..., ScM of the circuit to be tested and/or to be diagnosed are connected to the inputs E1, E2, ..., EM of the compactor K 50. The comparison vector V which has a length of k bits, is produced by the tester 51, and the error signal f and the values of the syndrome S1, S2, ..., Sm are emitted from the compactor 51 according to the invention.

Figure 6:
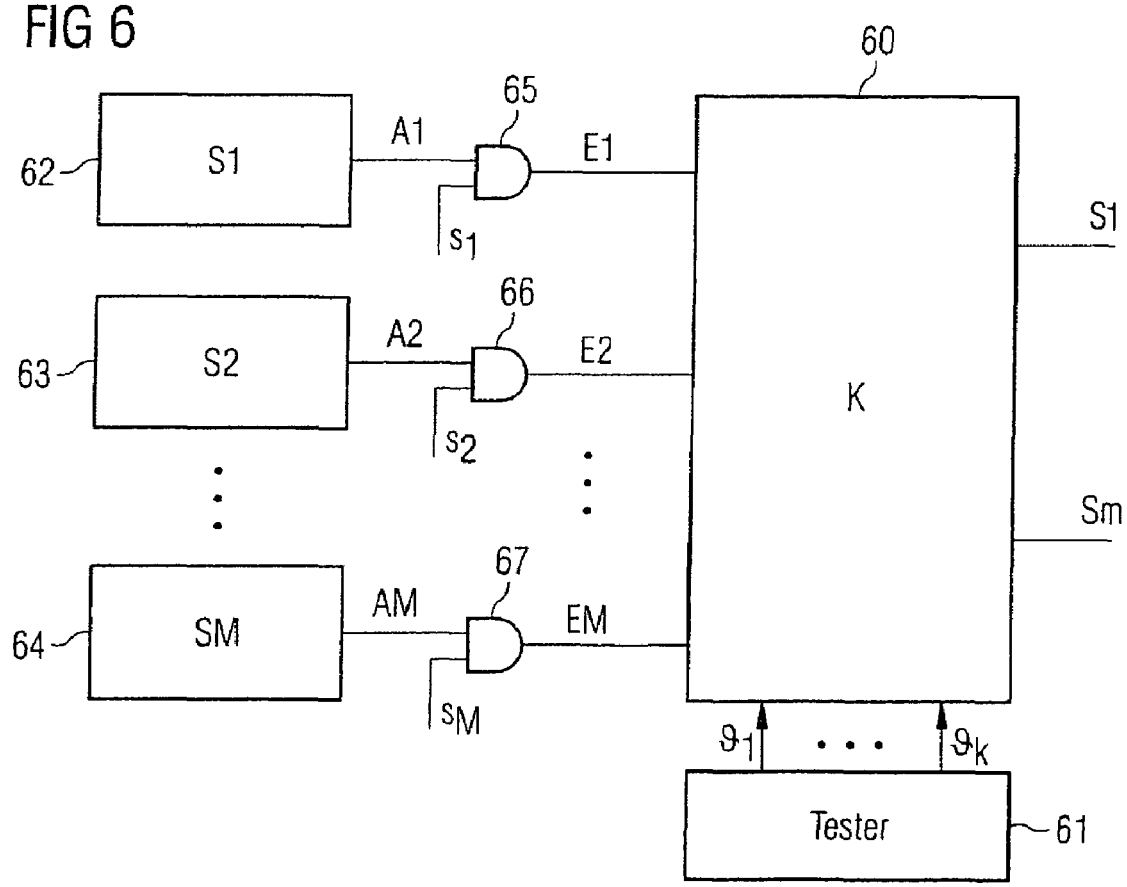
FIG. 6 shows a further compactor circuit according to an exemplary embodiment of the invention, together with a further circuit to be tested and to be diagnosed, which has scan paths.

FIG. 6 describes a first possible way to use a compactor according to the invention once undefined, so-called X values are also emitted from the circuit to be tested and diagnosed. X values such as these occur, for example, when specific areas of the circuit S are not initialized at the start of the test or of the diagnosis. These may be flip-flops or tristate components. These areas may assume random values, which are irrelevant for the test or the diagnosis. The time and the relevant output A of the circuit S at which an undefined X value such as this occur can be predicted by simulations or experiments preceding the test, although its specific value cannot be. In order to prevent this being incorrectly indicated as an error, it is masked or masked out according to the invention.

The circuit to be tested and/or to be diagnosed as shown in FIG. 6 has M outputs A1, A2, ..., AM of M scan paths S1, 62, S2 63, ..., SM 64.

The output A1 is passed to a first input of an OR gate 65 in order to mask undefined values, to whose second input a binary control signal $s_1$ is applied, and whose output is connected to a first input E1 of a compactor K 60 according to the invention.

The output A2 is passed, in order to mask undefined values, to a first input of an OR gate 66, to whose second input a binary control signal $s_2$ is applied, and whose output is connected to a second input E2 of the compactor K 60 according to the invention.

This structure is continued for all the outputs A3 to AM.

If, by way of example, an undefined value or an X value is predicted at the output A2 of the scan path S2 63 on the basis of previous experiments for a specific time, then the undefined value can be fixed at the value 1 at the input E2, or can be masked, simply by selecting the control signal S2 for this time t to be 1. At the times when no X value is predicted, the control signal is simply chosen to be equal to 0. x values or undefined values at the other outputs of the circuit to be tested and/or to be diagnosed can be masked in an entirely analogous manner. By way of example, the control variables $s_1, s_2, \ldots, s_m$ can be produced by the tester or else can be stored in the register for each test input vector for each scan path. The comparison vectors $v_1, \ldots, v_k$ which are entered in the compactor according to the invention by the tester 61 must then be chosen such that the value "undefined value" can be replaced by the defined value "1" wherever an undefined value occurs in the circuit to be tested and/or to be diagnosed.

If, by way of example, controlled AND gates are used for masking instead of the controlled OR gates 65, 66, 67, then the mask X value must be replaced by the defined value "0" whenever an X value is masked.

Figure 7:
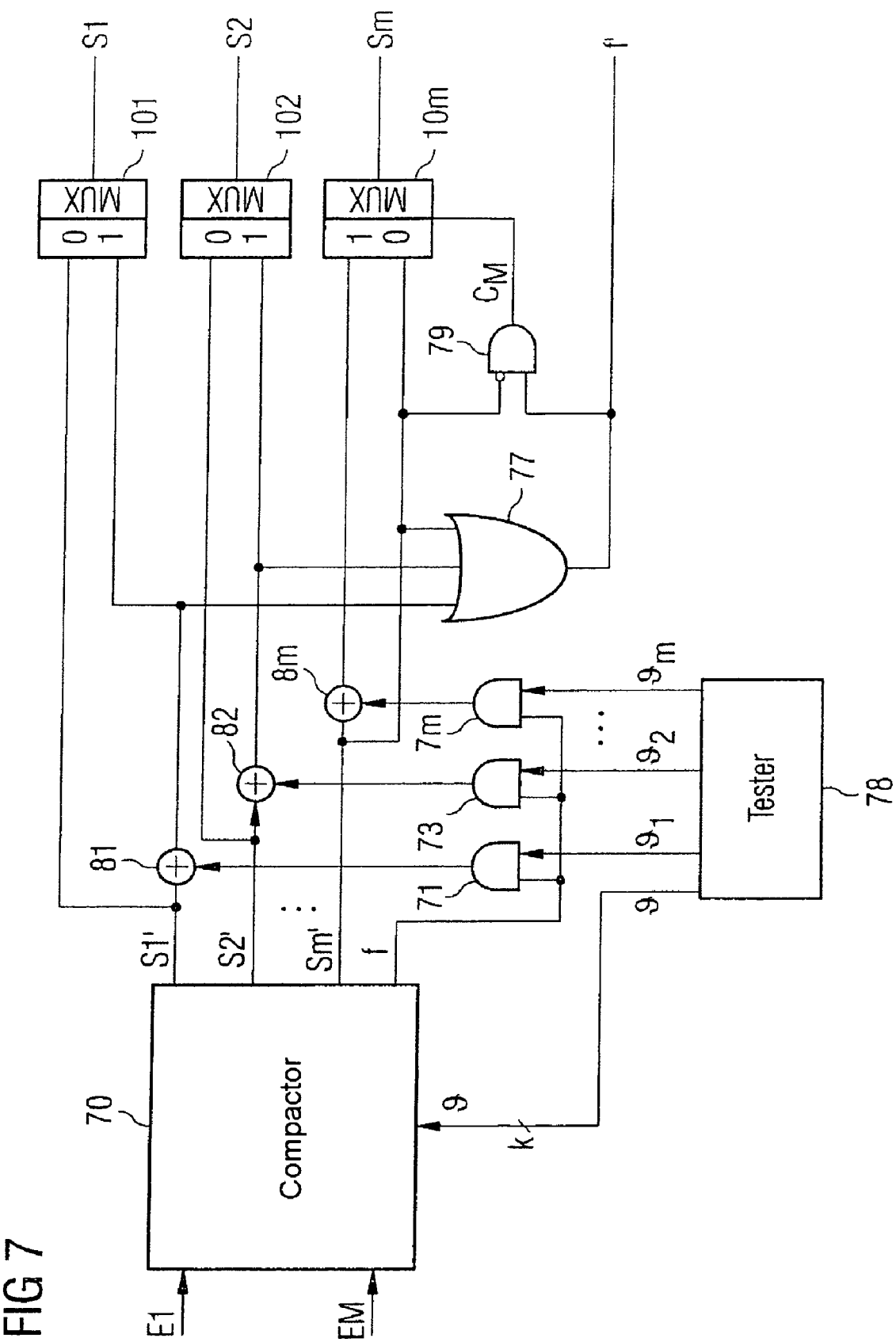
FIG. 7 shows a further compactor according to an exemplary embodiment of the invention, which is connected to a tester.

FIG. 7 shows a further application of an compactor according to another embodiment of the invention for testing and/or for diagnosis of a circuit with X values. The outputs A1, ..., AM of the circuit to be tested and/or to be diagnosed, and which are not shown in FIG. 7, are connected to the inputs E1, ..., EM of a compactor K70 according to the invention.

The compactor K70 according to the invention and with the inputs E1, ..., EM and the syndrome outputs S1', ..., Sm' has added to it a circuit comprising m XOR gates 81, ..., 8m, m AND gates 71, ..., m, m multiplexers 101, ..., 10m, and an OR gate 77 and a further AND gate 79, in order to make it possible to process X values with this addition. In this case, the invention is thus a compactor which corresponds to one of the compactors as described above and which additionally has external circuit components.

In this case, it is not absolutely essential for the X values to be masked when they occur to form 0 (or to form 1) at the circuit outputs of the circuit to be tested and to be diagnosed. The case of X values which have not been masked will be considered here.

The syndrome outputs of the compactor K 70 are in this case and in contrast to the compactors shown in FIGS. 1-6 not annotated by S1, ..., Sm but by S1, ..., Sm' since, in this case, they represent intermediate syndromes. If no X values are present, then the intermediate syndromes are the same as the syndromes of the errors or faults to be identified or to be diagnosed. If any X values occur, then these intermediate syndromes assume the value 1 when undefined or X values are present at the inputs of the compactor K 70 are corrected in the actual syndromes S1, ..., Sm of the errors or faults that have occurred. These corrected syndrome values allow the diagnosis of faulty outputs of the tested or diagnosed circuit, to be precise independently of which value (0 or 1) has actually occurred for an undefined value X.

The circuit illustrated in FIG. 7 is based on the assumption that the error-correcting code for the compactor K 70 is a generalized Hamming code. The compactor K 70 then produces parity of all of its input values E1, ..., EM which are compensated by the comparison vector v at that output which carries the m-th intermediate syndrome Sm'. The "parity" is in this case understood as an XOR sum. The comparison vector v which is produced by the tester is in this case defined such that it compensates for the fault-free test inputs to form 0 when no X value occurs. This is possible because test data and the comparison vector have previously been matched to one another by simulation.

If an undefined value occurs, then the comparison vector v is defined as if the undefined value were always 0. If the X value is actually equal to 0, then the comparison vector v compensates the test inputs without errors or faults to form 0. However, if the X value is actually equal to 1, then the comparison vector v does not completely compensate the test inputs without errors or faults, but compensates them to a syndrome value which is not equal to 0. The syndrome which is now caused by the X value 1 corresponds to a fault syndrome which will be produced by a 1-bit error at the same input at which the X value occurs. This syndrome which corresponds to the X value 1 is corrected to 0 by means of an m-dimensional correction vector w, which is likewise produced by the tester.

The circuit which is added to the compactor 70 according to the invention in FIG. 7 will now be described.

For i=1, ..., m, that output of the compactor K 70 which carries the intermediate syndrome value Si' is connected to the first input of the XOR gate 8i and at the same time to the 0-input of the multiplexer 10i. The output of the AND gate 7i is connected to the second input of the XOR gate 8i. That output of the compactor 70 which carries the error signal f is passed to the first input of this AND gate 7i.

In addition to the comparison vector v, which has already been described, is entered in the compactor K 70 and has a length of k bits, the tester 78 produces a further correction vector w=w1, w2, ..., wm, with a length of m bits, for correction of the intermediate syndrome S1', ..., Sm'. The i-th component wi of this correction vector is applied to the second input of the AND gate 7i.

The components w1, w2, ..., wm of the correction vector may also be regarded as masking values for the error signal f.

The output of the XOR gate 8i is at the same time passed to the 1 input of the multiplexer 10i and to the i-th input of the OR gate 77, which emits an error signal f at its output.

The output of the compactor K 70, which carries the m-th component Sm' of the intermediate syndrome, is furthermore passed in an inverted form to the first input of the AND gate 79, whose second input is connected to that output of the OR gate 77 which carries the error signal f.

The output of the AND gate 79 is connected to the control inputs of the multiplexers 101, 102, ..., 10n. The outputs of the multiplexers 101, 102, ..., 10m carry the corrected syndrome values S1, S2, ..., Sm.

The method of operation of the circuit illustrated in FIG. 7 will now be explained. Consider the situation in which there is no undefined value at the inputs E1, ..., EM of the compactor 70. In this case, the correction vector that is produced by the tester is w=w1, ..., wm=0, ..., 0.

If there are no faults in the circuit to be tested and/or to be diagnosed, then both the components S1', ..., Sm' and the error signal f are equal to 0. In addition, the correction vector w which is emitted from the tester assumes the value 0 for all its components. If i=1, ..., m, the value 0 is XOR-logically linked with Si' in the XOR gate 8i, so that Si=Si' XOR 0=Si'=0 and f'=0 (no error) is emitted. Since the error signal f' is equal to 0, the control signal $c_M$=0 is applied to the control inputs of the multiplexers 101, 102, ..., 10m, and the values of the syndromes S1=S1'=0, S2=S2'=0, ..., Sm=Sm'=0 are emitted at the outputs.

If there is now an error at one of the inputs E1, ..., EM of the compactor K 70, then this error is not compensated to 0 by the vector v that is produced by the tester. The error signal f assumes the value 1, and the syndrome of the error is emitted at the outputs S1', ..., Sm' of the compactor K 70 as an intermediate syndrome. Since there is no X value, the correction vector w=$w_1$, ..., $w_m$=(0, ..., 0) which is likewise produced by the tester is equal to 0. When i=1, ..., m, the value 0 is XOR-logically linked with Si' in the XOR gate 8i, so that Si=Si' XOR 0=Si' and f=1 (error) is emitted.

If this is a 1-bit error, then Sm'=1, and the value Sm'=0 is applied to the first input of the AND gate 79. The AND gate 79 emits the value $c_M$=0, which is applied to the control inputs of the multiplexers 101, 102, ..., 10m. The intermediate syndrome values S1', S2', ..., Sm' which are emitted from the compactor K 70 are thus emitted at the outputs of the multiplexers 101, ..., 10m. If i=1, ..., m, then Si=Si' and the values of the intermediate syndromes are in this case equal to the values of the syndromes of the error that has occurred.

Let us now assume that an undefined value 0 or 1, which is referred to as an X value, is applied to an input Ej at a specific time t. The time t and the input Ej are known, but the specific value 0 or 1 is not known. The k-dimensional binary comparison vector v which is emitted from the tester is now defined as if the undefined value at the output Ej would always assume the value 0.

Thus, for this comparison vector:

$$v(t) = H \times (E1(t), \ldots Ej-1(t), 0, Ej+1, \ldots, EM)^T$$

where H denotes the monitoring or parity checking matrix of the linear error-correcting code under consideration, and $(E1(t), \ldots, Ej-1(t), 0, Ej+1, \ldots, EM)^T$ denotes the transposed or column vector.

The m-dimensional binary correction value w is defined such that:

$$w = H \times \underbrace{(0, \ldots, 0, 1, 0, \ldots, 0)^T}_{j}$$

where H is once again the monitoring or parity checking matrix of the linear error-correcting code under consideration, and $$\underbrace{(0, \ldots, 0, 1, 0, \ldots, 0)^T}_{j}$$

denotes the transposed vector or column vector.

It should be noted that the value w=S1', ..., Sm' is emitted by the compactor K 70 on inputting E1, ..., $$EM = \underbrace{(0, \ldots, 0, 1, 0, \ldots, 0)}_{j}$$

and $v_1, \ldots, v_k$=0, ..., 0.

The two following situations will also be considered, in order to explain the method of operation.

In the first case, the X value assumes the value 0 at the input Ej, and there is no fault in the circuit to be tested and diagnosed.

In this case, the compactor K 70 emits the values 0 both at the outputs which carry the intermediate syndrome S1', ..., Sm' and at the output which carries the error signal f. The components of the correction vector $w_1, \ldots, w_m$ which is produced by the tester 78 are logically linked in the AND gates 71, 72, ..., 7m with the error signal f=0, in each case to form 0. Those components of the intermediate syndrome S1'=0, ..., Sm'=0 which are emitted from the compactor K 70 are each logically linked with 0 in the XOR gates 81, 82, ..., 8m to form 0. The error signal f' which is emitted from the OR gate 77 is thus equal to 0. The signal $c_M$, which is emitted at the output of the AND gate 79 and is likewise equal to 0, and the multiplexers 101, 102, ..., 10m each connect their 0-input to their output. The values S1=S1'=0, ..., Sm=Sm'=0 are thus emitted as syndrome values at the outputs of the multiplexers 1010, ..., 10m.

In the second case, the X value assumes the value 1 at a time t at the input Ej, and a 1-bit error occurs at the same time in the circuit to be tested and diagnosed.

In this case, the compactor K 70 emits the fault syndrome S1', ..., Sm', which takes account not only of the assumed 1-bit error but also of the X value 1. The error signal is f=1.

Since the error signal is f=1, the components which are applied to the first inputs of the AND gates 71, 72, ..., 7m of the correction vector (w=$w_1$, ..., $w_m$) which is produced by the tester are emitted unchanged with the outputs of these AND gates 71, ..., 7m, and are logically linked in the XOR gates 81, 82, ..., 8m with the components S1', ..., Sm'.

The X value of 1 which is applied to the input Ej of the compactor K 70 is thus compensated at the outputs of the XOR gates 81, 82, ..., 8m. The corrected syndrome which is produced at the outputs of the XOR gate now contains only the error information for the assumed one-bit error. The component Sm' of the intermediate syndrome governs the overall parity of the compensated inputs of the compactor 70. Owing to the X value of 1 which occurs at the same time +, and the assumed 1-bit error, the component Sm' of the fault syndrome is equal to 0.

The intermediate syndrome corrected by w is emitted at the outputs of the XOR gates 81, ..., 8m. The correction by w takes account of the value 1 of the X value, but not the simultaneously occurring fault in the circuit to be tested and to be diagnosed, and the outputs of the XOR gates 81, ..., 8m are not equal to 0, ..., 0.

The OR gate 77 emits the error signal f'=1. The values f'=1 and $\overline{Sm'}$=1 are applied to the inputs of the AND gate 79. The control signal $c_M$ for the multiplexers 101, 102, ..., 10m is thus equal to 1. The outputs of the XOR gates 81, 82, ..., 8m which carry those values of the fault syndrome S1, S2, ..., Sm which have been corrected with respect to the X value 1 are passed on by the multiplexers 101, 102, ..., 10m to the outputs. The error signal f'=1 indicates that an error is present. The function of the other possible cases of error identification is entirely analogous to the examples described above, and will therefore not be explained in any more detail here.

Figure 10:
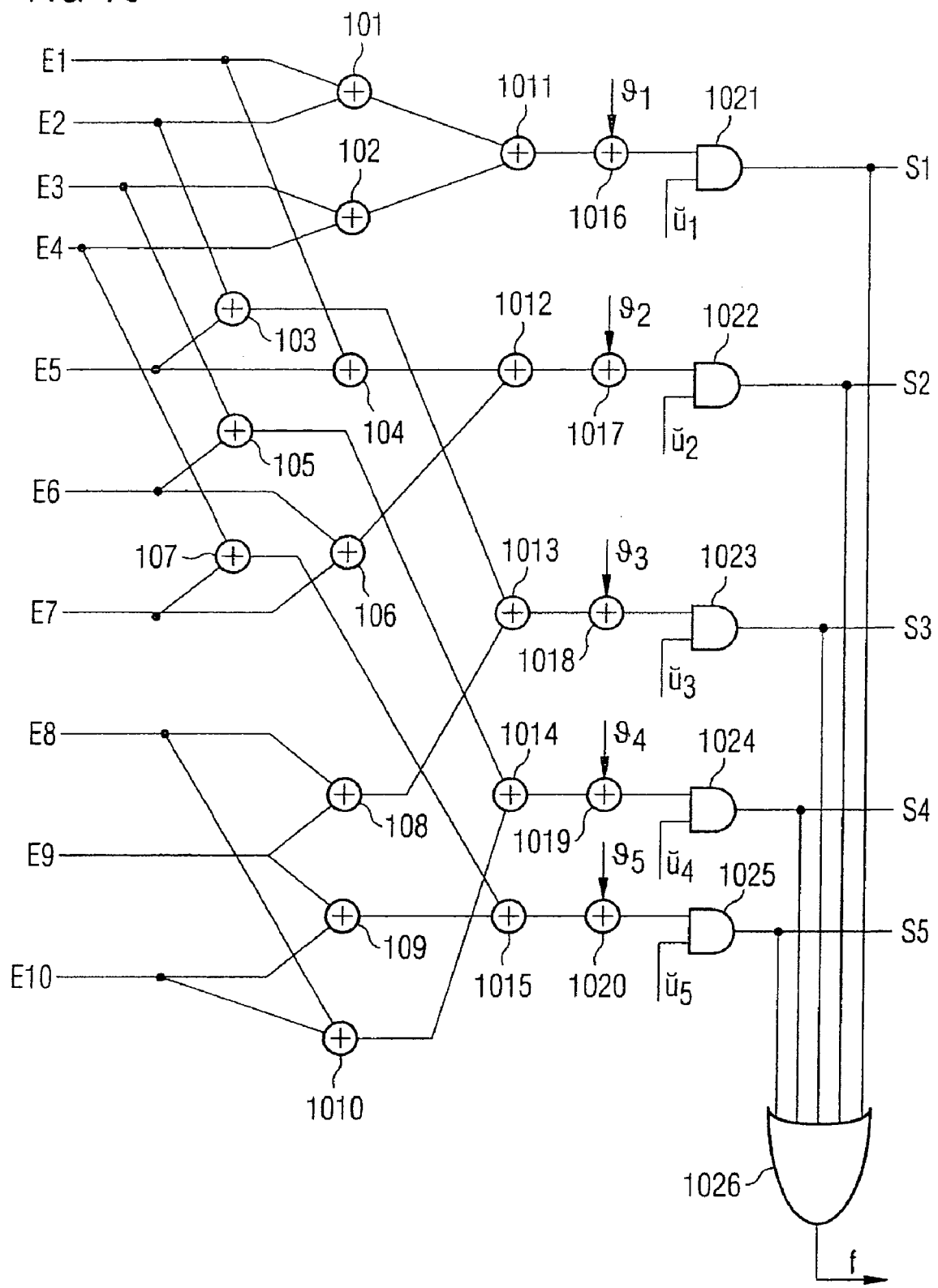
FIG. 10 shows a further compactor circuit according to an exemplary embodiment of the invention.

FIG. 10 shows a further advantageous refinement of a compactor according to the invention, when undefined or X values occur in the circuit to be tested and/or to be diagnosed. The compactor in FIG. 10 has the inputs E1, E2, ..., E10 to which the outputs of the circuit to be tested and/or diagnosed are connected, the five syndrome outputs S1, S2, S3, S4, S5 and a further output which carries the error signal f. In this case, a code with the H matrix $$H = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix}$$

is chosen as the error-correcting code.

The input E1 is at the same time connected to the first input of the XOR gate 101 and to the first input of the XOR gate 104. The input E2 is at the same time connected to the second input of the XOR gate 101 and to the first input of the XOR gate 103. The input E3 is at the same time connected to the first input of the XOR gate 102 and to the first input of the XOR gate 105. The input E4 is at the same time connected to the second input of the XOR gate 102 and to the first input of the XOR gate 107. The input E5 is at the same time connected to the second input of the XOR gate 103 and to the second input of the XOR gate 104. The input E6 is connected to the second input of the XOR gate 105 and to the first input of the XOR gate 106. The input E7 is connected to the second input of the XOR gate 106 and to the second input of the XOR gate 107. The input E8 is connected to the first input of the XOR gate 108, and to the first input of the XOR gate 1010. The input E9 is connected to the second input of the XOR gate 108 and to the first input of the XOR gate 109. The input E10 is connected to the second input of the XOR gate 109 and to the second input of the XOR gate 1010.

The output of the XOR gate 101 is passed to the first input of the XOR gate 1011. The second input of XOR gate 1011 is connected to the output of the XOR gate 102, and the output of XOR gate 1011 is connected to the second input of the XOR gate 1016. The comparison value $v_1$, which is produced by the tester, is applied to the first input of the XOR gate 1016. The output of the XOR gate 1016 is passed to the first input of the AND gate 1021. The control value $u_1$, which is likewise produced by the tester, is applied to its second input in order to mask any predicted X value. The output of the AND gate 1021 is at the same time connected to the syndrome output S1 and at the same time to the first input of the OR gate 1026, at whose output the error signal f is emitted.

The output of the XOR gate 104 is passed to the first input of the XOR gate 1012, and the second input of XOR gate 1012 is connected to the output of the XOR gate 106. The output out XOR gate 1012 is connected to the second input of the XOR gate 1017. The comparison value $v_2$, which is produced by the tester, is applied to the first input of the XOR gate 1017. The output of the XOR gate 1017 is passed to the first input of the AND gate 1022. The control value $u_2$, which is likewise produced by the tester, is applied to its second input, in order to mask any existing X value. The output of the AND gate 1022 is at the same time connected to the syndrome output S2 and to the second input of the OR gate 1026, at whose output the error signal f is emitted.

The output of the XOR gate 103 is passed to the first input of the XOR gate 1013, and the second input of XOR gate 1013 is connected to the output of the XOR gate 108. The output of XOR gate 1013 is connected to the second input of the XOR gate 1018. The comparison value $v_3$, which is produced by the tester, is applied to the first input of the XOR gate 1018. The output of the XOR gate 1018 is passed to the first input of the AND gate 1023, to whose second input the control value $u_3$, which is likewise produced by the tester, is applied in order to mask any existing X value. The output of the AND gate 1023 is at the same time connected to the syndrome output S3 and to the third input of the OR gate 1026, at whose output the error signal f is emitted.

The output of the XOR gate 105 is passed to the first input of the XOR gate 1014, whose second input is connected to the output of the XOR gate 1010. The output of XOR gate 1014 is connected to the second input of the XOR gate 1019, to whose first input the comparison value $v_4$, which is produced by the tester, is applied. The output of the XOR gate 1019 is passed to the first input of the AND gate 1024, to whose second input the control value $u_4$, which is likewise produced by the tester, is applied in order to mask any existing X value. The output of the AND gate 1024 is at the same time connected to the syndrome output S4 and to the fourth input of the OR gate 1026, at whose output the error signal f is emitted.

The output of the XOR gate 107 is passed to the first input of the XOR gate 1015, whose second input is connected to the output of the XOR gate 109. The output of XOR gate 1015 is connected to the second input of the XOR gate 1020, to whose first input the comparison value $v_5$, which is produced by the tester, is applied. The output of the XOR gate 1020 is passed to the first input of the AND gate 1025, to whose second input the control value $u_5$, which is likewise produced by the tester, is applied in order to mask any existing X value. The output of the AND gate 1025 is at the same time connected to the syndrome output S5 and to the fifth input of the OR gate 1026, at whose output the error signal f is emitted.

The masking of an undefined or X value will now be explained using an example. If, for example, an X value is applied at a specific time t to the input E2 of the compactor shown in FIG. 10, therefore although the time t is known from the previous simulation of this situation, it is not known, however, whether the value that is then applied is 1 or 0, although this should not be regarded as a circuit fault. In this situation, the outputs of an error signal f=1 of the output at the OR gate and of a fault syndrome which is not equal to 0,0,0, 0,0 at the syndrome outputs S1, ..., S5 should be avoided.

It should be noted that the undefined value at the input E2 can affect the syndrome output S1 and the error signal f of the gate 1026 via the gates 1010, 1011, 1016 and 1021 if the control value $u_1$, which is produced by the tester, for the AND gate 1021 is equal to 1. However, this effect does not occur when the control value $u_1$ for this gate is equal to 0.

It should likewise be noted that the undefined value of the input E2 can at the same time affect the syndrome output S3 and the error signal of the gate 1026 via the gates 103, 1013, 1018 and 1023 if the control value $u_3$, which is produced by the tester, for the AND gate 1023 is equal to 1. However, this affect does not occur when the control value $u_3$ is equal to 0.

If the test now sets each of the control signals $u_1$ and $u_3$ to the value 0 for the time t, then the syndrome outputs which could be affected by the undefined value are set to be equal to 0, and the undefined value is masked.

The syndrome outputs S2, S4 and S5 are not influenced by the undefined value at the input E2. They can still be used for error identification and for diagnosis at the time t, when the undefined value occurs at the input E2. This saves time during the test, since the test would otherwise have to be incorrectly interrupted as being erroneous.

In comparison to the described method, the masking of undefined values exclusively at the outputs of a circuit to be tested and/or to be diagnosed has the disadvantage that, in the case of circuits that are relevant in practice, for example with about 1,000 outputs which may, for example, be outputs of scan chains, a large amount of control information must be made available by the tester, and this is disadvantageous. It should be noted that the masking of undefined values in conjunction with a compactor according to the invention is advantageous, since the masking of the undefined values can take place on considerably fewer lines, and even only exclusively on the syndrome outputs in the example illustrated in FIG. 10, which requires considerably less control information, which has to be provided in a complex manner by the tester.

The following text describes how a common line can be used for the signals v and u. The masking of unknown or undefined values can be performed efficiently by means of the circuit element which is described in DE 103 35 809.9. The element described there converts a three-value input signal E with the possible signal values '0', '1' and 'Z' to two binary output signals $A_1$ and $A_2$ with the possible signal values '0' and '1'. Table 1 shows the association between input signal values and output signal values.

| Input E | Output $A_1$ | Output $A_2$ |
| --- | --- | --- |
| 0 | 0 | 1 |
| 1 | 1 | 1 |
| Z | 0 or 1 | 0 |

According to FIG. 10, a circuit element such as this is used for each pair of comparison signals $v_i$ and masking signals $u_i$. The inputs $E_i$ are connected to the external tester, the outputs $A_{1,i}$ are connected to the comparison signals $v_i$, and the outputs $A_{2,i}$ are connected to the masking signals $u_i$.

If no unknown value to be masked occurs within the circuit, the external tester produces the expected value '0' or '1' to be compared. If an unknown value to be masked does occur, the external tester produces the value 'Z'. This leads to the corresponding masking elements, 1021 to 1025 in FIG. 10, masking out the unknown value and producing a defined and known value '0' at their output instead.

The masking out process prevents the error signal f from being set incorrectly to '1' by an unknown signal value which is irrelevant to the test. This means that all of the syndrome values $S_i$ for the syndrome S are always known.

Figure 11:
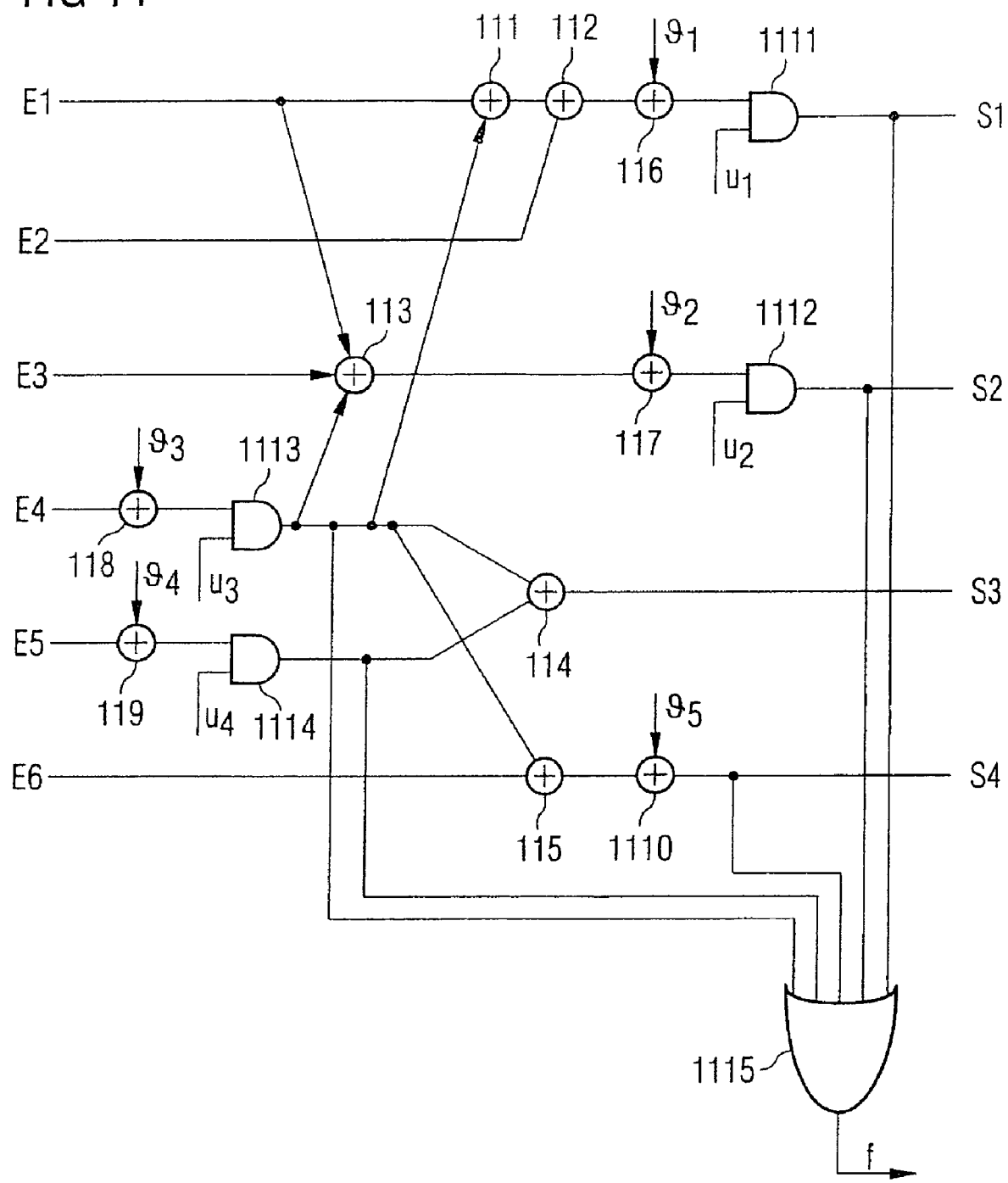
FIG. 11 shows a further compactor circuit according to an exemplary embodiment of the invention.

FIG. 11 shows a further refinement of a compactor according to the invention, when undefined values or X values occur in the circuit to be tested and/or to be diagnosed. The compactor in FIG. 11 has six inputs E1, ..., E6 to which the outputs of the circuit to be tested and/or to diagnosed are connected, and four syndrome outputs S1, S2, S3, S4. The input E1 is at the same time connected to the first input of the XOR gate 111 and to the first input of the XOR gate 113. The input E2 is connected to the second input of the XOR gate 112, whose first input is connected to the output of the XOR gate 111. The input E3 is connected to the second input of the XOR gate 113. The input E4 is connected to the second input of the XOR gate 118, to whose first input the comparison value $v_3$, which is produced by the tester, is applied and whose output is passed to the first input of the AND gate 1113, to whose second input the signal $u_3$, which is likewise produced by the tester, is applied in order to mask X values. The input E5 is connected to the second input of the XOR gate 119, to whose first input the comparison value $v_4$, which is produced by the tester, is applied and whose output is passed to the first input of the AND gate 1114, and to whose second input the signal $u_4$, which is likewise produced by the tester, is applied in order to mask X values.

The input E6 is connected to the second input of the XOR gate 115, whose first input is connected to the output of the AND gate 1113, which is at the same time passed to the first input of the XOR gate 114 and to the first input of the OR gate 1115. The output of the AND gate 1114 is at the same time connected to the second input of the XOR gate 114 and to the second input of the OR gate 1115.

The output of the XOR gate 112 is connected to the second input of the XOR gate 116, to whose first input the comparison signal $v_1$, which is produced by the tester, is applied and whose output is passed to the first input of the AND gate 1111, to whose second input the signal us, which is produced by the tester, is applied in order to mask X values, and whose output is at the same time connected to the syndrome output S1 and to the fifth input of the OR gate 1115.

The output of the XOR gate 113 is connected to the second input of the XOR gate 117, to whose first input the comparison signal $v_2$, which is produced by the tester, is applied and whose output is passed to the first input of the AND gate 1112, to whose second input the signal $u_2$, which is produced by the tester, is applied in order to mask X values, and whose output is at the same time connected to the syndrome output S2 and to the fourth input of the OR gate 1115.

The output of the XOR gate 114 is connected to the syndrome output S3. The output of the XOR gate 115 is connected to the second input of the XOR gate 1110, to whose first input the comparison value $v_5$, which is produced by the tester, is applied and whose output is at the same time connected to the syndrome output S4 and to the third input of the OR gate 1115. The output of the OR gate 115 carries the error signal f.

The compactor shown in FIG. 11 is based on the assumption that no undefined values occur at that output of the circuit to be tested and/or to be diagnosed which is connected to the input E6 of the compactor, and thus that no masking of undefined values is required for this input of the compactor.

A further assumption is that undefined values can occur frequently at those outputs of the circuit S to be tested and/or to be diagnosed which are connected to the inputs E4 and E5, which undefined values should therefore be masked as closely as possible to the input of the compactor in order to prevent them from being able to affect the diagnosis of other input values. This is worth mentioning because undefined values occur frequently at these inputs of the compactor, where they can advantageously be masked directly at that point.

It should be noted that X values which occur at a subset of the other inputs E1, E2, E3, E4 and E5 can be masked in the compactor shown in FIG. 11. There is no need to mask any other subset of inputs, which in this case comprises the input E6, since no X values occur at this subset of inputs.

Figure 8:
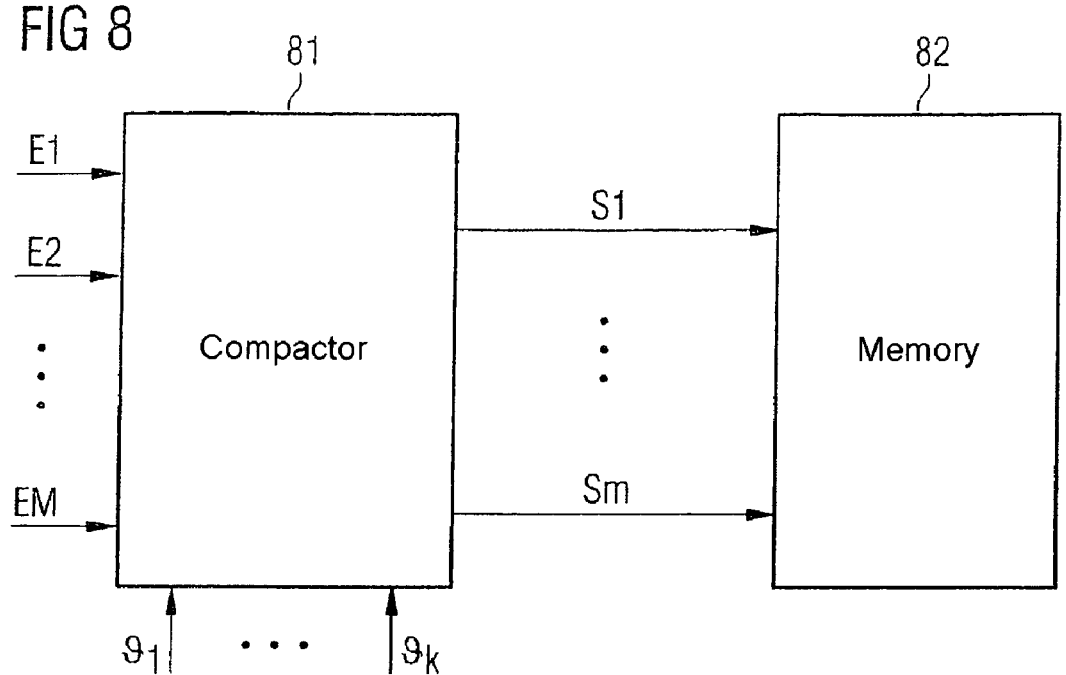
FIG. 8 shows a further compactor according to an exemplary embodiment of the invention, which has a memory.

FIG. 8 shows the outline circuit diagram of a compactor 81 according to the invention, whose incorrect syndrome values are stored in a memory 82, in which case the memory 82 may be provided on the chip or away from the chip. The tested circuit, which is not shown in FIG. 8, enters its test responses into the inputs E1, ..., EM on the basis of the test patterns which are entered by the tester in the circuit to be tested. At the same time, the tester also produces the comparison values $v_1, \ldots v_k$ as additional inputs for the compactor 81. As already stated, k may in this case be chosen as a value between M and m. The compactor 81 emits at its outputs S1, ... Sm the syndrome values which have been compacted on the basis of the code that is used, and which are stored in the memory 82 as a function of additional signals at various, preferably successive, addresses. It is preferable to store only those syndrome values which are not equal to 0 and which explain a fault in the circuit to be diagnosed for the selected error-correcting code. In this case, the additional signals contain the normal control signals for a memory and, for example, the marking of the times at which incorrect syndrome values have been stored in the memory 82.

Figure 9:
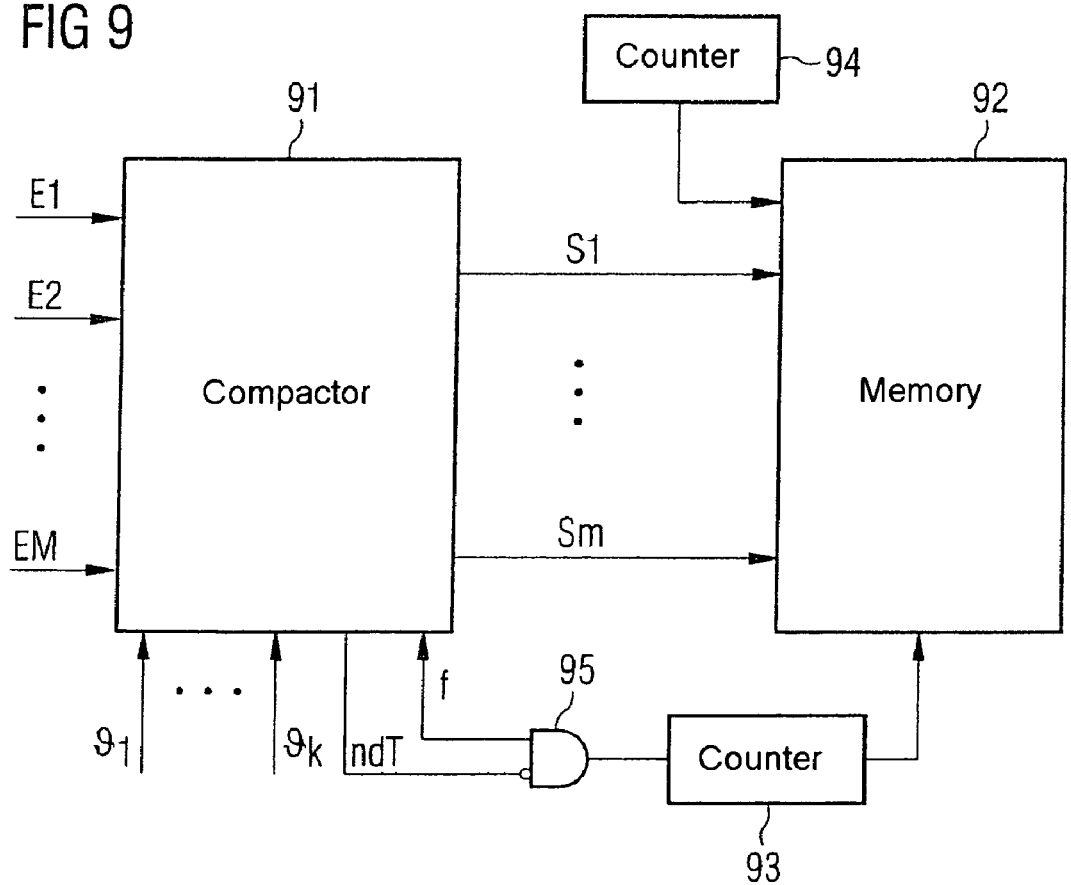
FIG. 9 shows a further compactor according to an exemplary embodiment of the invention, which has a further memory.

FIG. 9 shows one embodiment of a compactor according to the invention, whose erroneous results are stored in the memory unit during the testing and/or diagnosis process. The tested circuit, which is not shown in FIG. 9, enters its test responses into the inputs E1, ..., EM on the basis of the test patterns which are entered in the circuit by the tester. The tester at the same time also produces the comparison values $v_1, \ldots, v_k$ as additional inputs for the compactor 91. As already stated, k may in this case be chosen as a value between M and m.

At its outputs S1, ..., Sm, the compactor 91 emits the syndrome values which have been compacted in accordance with the code that is used. These values have the value (0, ..., 0) when no fault is present in the circuit to be tested. At the same time, the compactor 91 emits an error signal f which is equal to 1 when a fault is present in the circuit to be tested. The error signal is equal to 0 when no faults are present in the circuit to be tested. The error signal is passed to the first input of an AND gate 95. At the same time, the compactor 91 also emits the signal ndT. This signal is passed in a negated form to the second input of the AND gate 95, whose output value is counted in the counter 93, whose state is applied as an address to the memory 92. The output of the AND gate is also at the same time used as a write enable signal for the memory 92, so that a syndrome is written to successive addresses in the memory 92 only when the circuit has a fault which can be diagnosed unambiguously from the syndrome, as expressed by a value f+1 and ndT=0. In this case, the counter 94 is in the initial state 0 and it autonomously increments its state by 1 in each close cycle, so that the state of the counter indicates the time at which a specific value of the syndrome has been applied to the input of the memory 92. The state of the counter 94 is stored at the same time as the syndrome, when the outputs of the AND gate 95 is equal to 1. It should be noted that the syndrome values which are not equal to 0 and allow the fault which has been emitted in the circuit to be diagnosed unambiguously are stored together with the time of their occurrence in the memory 92.

The control signals, such as the write and read signals, the clock signals and the like are not shown in FIG. 9, since the implementation of a memory is familiar to those skilled in the art. The memory 92 may in this case be implemented on the tested chip or else an additional unit. The data can be read from the memory 92 after the completion of the test, for example, with the erroneous inputs into the compactor being diagnosed only then. If the number of errors or faults which can be diagnosed with the aid of the code that is used is greater than the number of words which can be stored in the memory 92, then it is possible to end the diagnosis of the circuit under consideration when, for example, the counter 93 reaches a specific maximum state. It is likewise possible to read the data from the memory 92 when the memory 92 is full, and then to continue the diagnosis process.

Figure 12:
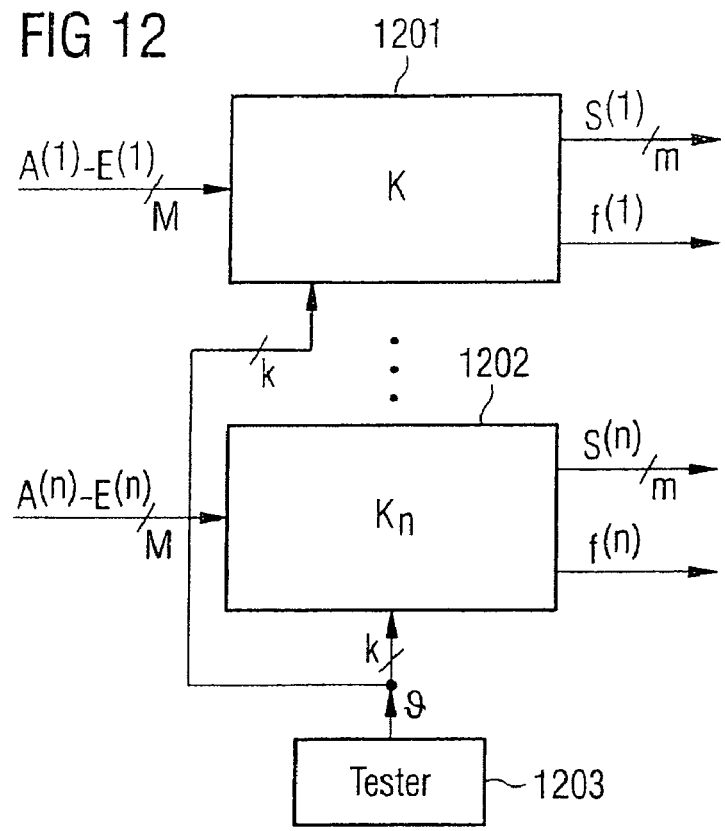
FIG. 12 shows a large number of further compactors according to an exemplary embodiment of the invention, which are connected to a single tester.

FIG. 12 shows an arrangement of n identical compactors according to the invention K1 1201, ..., Kn 1202 for simultaneous testing and/or for simultaneous diagnosis of n identical circuits. Each of the inputs with a length of M bits, each of the syndrome outputs with a length m bits and the output which carries the error signal with a length of 1 bit are respectively annotated $E^{(1)}, S1^{(1)}, f^{(1)}, \ldots, E^{(n)}, S^{(n)}, f^{(n)}$. The outputs $A^{(1)}, \ldots,$ are connected to the inputs $E^{(1)}$ of the compactor K1 1201, the outputs A(n) of the circuits to be tested or to be diagnosed and which are each physically identical are connected to the inputs $E^{(n)}$ of the compactor Kn 1202. The tester 1203 provides the same k-dimensional comparison signals v for all n compactors K1 1201, ..., Kn 1203. When undefined values occur in the identical circuits to be tested and/or to be diagnosed, then the tester provides the n compactors with further signals, which are also the same for all of the compactors, for example signals for masking the unknown values, such as those which have been described in the exemplary embodiments in FIG. 10 and FIG. 11, or for correction of the X values, as has been described in the exemplary embodiment in FIG. 7.

If the erroneous syndrome which are emitted from the compactors are stored, as has been described in the exemplary embodiments in FIGS. 8 and 9, then the same memories 82, 92 can in each case be connected to the compactors K1 1201, ..., Kn 1202.

It should be noted that, as a result of the simultaneous testing and/or diagnosis of n identical circuits, only one tester need be provided, which is advantageous.

Figure 13:
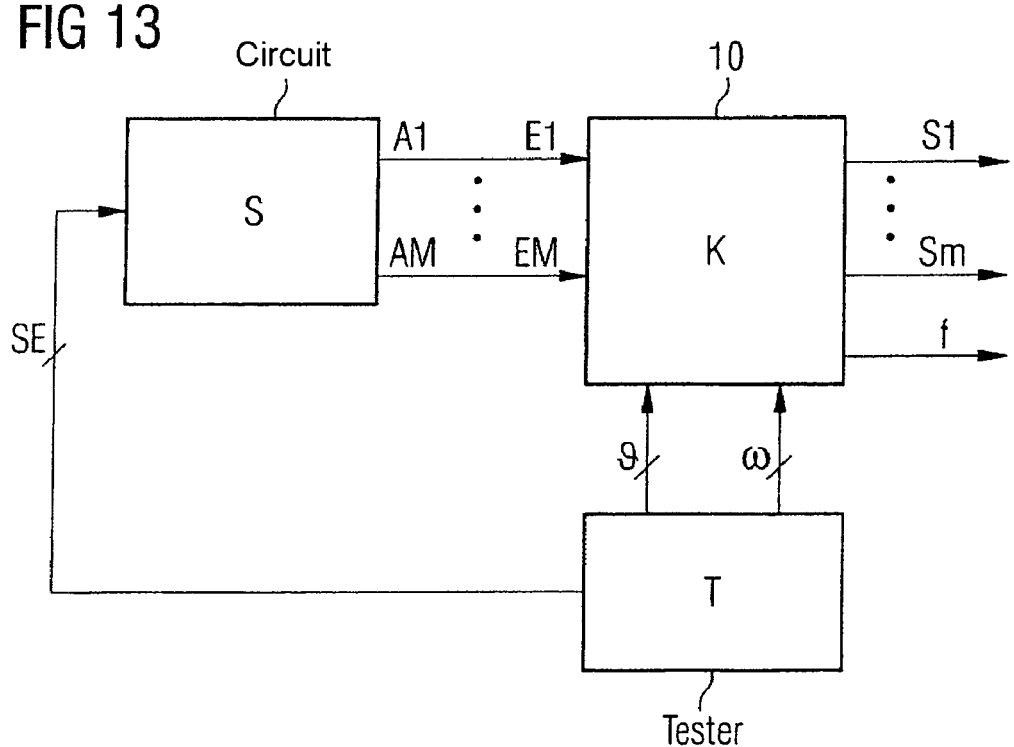
FIG. 13 shows a circuit which is connected to a further compactor according to an exemplary embodiment of the invention, with a tester providing test data for the circuit as well as comparison data and compensation data for the compactor.

FIG. 13 shows how a circuit S with outputs $A_1$ to $A_N$ is connected to the inputs $E_1$ to $E_N$ of a compactor K10. In this case, the compactor K 10 has syndrome output $S_1$ to $S_m$ as well as an error indication signal f. One tester T produces test data SE for the circuit S as well as comparison data v and compensation data w for the compactor K 10.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A compactor, comprising:
    a plurality of test data inputs that are connectable to circuit outputs of an electrical circuit, a plurality of test comparison inputs, and a plurality of test data outputs;
    a plurality of H matrix XOR gates arranged as a switching mechanism between the test data inputs and the test data outputs such that data applied to the test data inputs is produced at the test data outputs compressed in accordance with coefficients of an H matrix of an error-correcting code; and
    compensation XOR gates arranged between the test data inputs and the test data outputs, each compensation XOR gate including an input for receiving a compensation value.

2. A test arrangement, comprising:
    the circuit arrangement according to claim 1;
    a tester that supplies predetermined test input values to inputs of the electronic circuit, supplies predetermined compensation values at the test comparison inputs of the compactor, and supplies predetermined masking signals at any masking inputs.

3. The test arrangement of claim 2, wherein the tester supplies the predetermined test input values to inputs of two or more identical electronic circuits, supplies the predetermined compensation values to the test comparison inputs of respective compactors for the two or more electronic circuit, and supplies predetermined masking signals to any masking inputs of the two or more electronic circuits.

4. A circuit arrangement, comprising:
    an electronic circuit to be tested and/or diagnosed comprising a plurality of circuit inputs for receiving input data and a plurality of circuit outputs for supplying output data;
    a compactor comprising: test data inputs connected to the circuit outputs, test comparison inputs, and test data outputs; a plurality of H matrix XOR gates arranged as a switching mechanism between the test data inputs and the test data outputs such that the data applied to the test data inputs is produced at the test data outputs compressed in accordance with coefficients of an H matrix of an error-correcting code; and compensation XOR gates arranged between the test data inputs and the test data outputs, each compensation XOR gate including an input for receiving a compensation value.

5. The circuit arrangement of claim 4, further comprising at least one error indication circuit whose inputs are connected to signal paths between the test data inputs and test data outputs, the error indication circuit generating an error indication signal.

6. The circuit arrangement of claim 5, wherein the error indication circuit is an OR gate.

7. The circuit arrangement of claim 5, wherein the error indication circuit is a combinational switching mechanism that emits an error signal in response to a number of error signals exceeding a predetermined threshold value.

8. The circuit arrangement of claim 3, further comprising a first circuit including XOR gates, AND gates, and multiplexers for processing X values, wherein:
    the test data outputs of the compactor provide intermediate syndrome values and are respectively connected to inputs of the XOR gates of the first circuit and to inputs of the multiplexers;
    the outputs of the XOR gates of the first circuit are connected to inputs of the multiplexers;
    the error indication signal is supplied to inputs of the AND gates, and a plurality of connection values are respectively applied to inputs of the AND gates; and
    outputs of the AND gates are respectively applied to inputs of the XOR gates of the first circuit.

9. The circuit arrangement of claim 8, further comprising a second circuit including at least one OR gate and at least one further AND gate which provide an error indication when an X value occurs, wherein outputs of the XOR gates of the first circuit are supplied to inputs of the at least one OR gate, which generates an error signal.

10. The circuit arrangement of claim 5, wherein at least some portions of the electronic circuit, the compactor, and/or the error indication circuit are components of an integrated circuit.

11. The circuit arrangement of claim 4, wherein the compensation XOR gates are arranged downstream from the H matrix XOR gates and upstream of the test data outputs in a signal flow direction.

12. The circuit arrangement of claim 4, wherein the compensation XOR gates are arranged upstream of the H matrix XOR gates and downstream from the test data inputs in a signal flow direction.

13. The circuit arrangement of claim 4, wherein the compensation XOR gates are arranged between the H matrix XOR gates, the test data outputs, and the test data inputs in a signal flow direction such that a predetermined compression rate of a test result and a predetermined error indication probability for an error situation result.

14. The circuit arrangement of claim 4, further comprising a masking apparatus arranged upstream of one or more test data inputs for applying a predetermined masking signal.

15. The circuit arrangement of claim 4 further comprising one or more masking devices respectively arranged upstream of one or more of the test data outputs of the compactor, the one or more masking devices being configured to apply a predetermined masking signal.

16. The circuit arrangement of claim 4, further comprising one or more masking devices respectively arranged upstream of one or more compensation XOR gates, the one or more masking devices being configured to apply a predetermined masking signal.

17. The circuit arrangement of claim 4, wherein at least one masking device is arranged immediately downstream from a compensation XOR gate.

18. The circuit arrangement of claim 17, wherein an input of at least one compensation XOR gate and an input of at least one masking device are connected to each another so as to produce a common control.

19. The circuit arrangement of claim 17, wherein the at least one masking device is an OR gate, an AND gate, a NOR gate, or a NAND gate.

20. The circuit arrangement of claim 4, wherein at least some of the test data inputs of the compactor are connected to circuit outputs of the electronic circuit, which are outputs of scan paths.

21. The circuit arrangement of claim 2, further comprising a memory apparatus for storing data produced at the test data outputs.

22. The circuit arrangement of claim 21, wherein the memory apparatus is arranged on a semiconductor chip on which the electronic circuit and the compactor are arranged.

23. The circuit arrangement of claim 21, wherein the memory apparatus and the compactor are provided outside of a semiconductor chip on which the electronic circuit is provided.

24. The circuit arrangement of claim 21, wherein the memory apparatus and the electronic circuit are provided on a same semiconductor chip, with the compactor being provided outside of said same semiconductor chip.

25. The circuit arrangement of claim 21, wherein the compactor and the electronic circuit are provided on a same semiconductor chip, with the memory apparatus being provided outside of said same semiconductor chip.

26. A method of operating a circuit arrangement for testing an electronic circuit, the circuit arrangement comprising: the electronic circuit including circuit inputs for receiving input data and circuit outputs for supplying output data; and a compactor including: test data inputs connected to the circuit outputs, test comparison inputs, and test data outputs; a plurality of H matrix XOR gates arranged as a switching mechanism between the test data inputs and the test data outputs such that the data applied to the test data inputs is produced at the test data outputs compressed in accordance with coefficients of an H matrix of an error-correcting code; compensation XOR gates arranged between the test data inputs and the test data outputs, each compensation XOR gate including an input for receiving a compensation value; and at least one error indication circuit whose inputs are connected to signal paths between the test data inputs and test data outputs, the error indication circuit generating an error indication signal in response to generation of an erroneous signal pattern at the test data outputs, the method comprising:

calculating a plurality of test data items as a set of mutually associated input data, output data and compensation values, such that the mutually associated output data is compressed in accordance with coefficients of the H matrix of the error-correcting code with respect to the mutually associated input data, wherein the mutually associated compensation values are generated such that a predetermined signal pattern is produced at the test data outputs if actual output data matches expected output data;

applying the input data to the circuit inputs;

generating a signal pattern at the test data outputs; and generating an error indication signal in response to generation of an erroneous signal pattern at the test data outputs.

27. The method of claim 26, wherein the input data is applied to the circuit inputs in a test mode until all of the input data has been processed, with a determination being made as to whether an error indication signal has occured in one or more input data items.

28. The method of claim 26, wherein the input data is applied to the circuit inputs in a test mode until an error indication signal occurs.

29. The method of claim 26, further comprising:
    recording and evaluating data produced at the test data outputs in response to an error indication signal being generated from the input data being applied to the circuit inputs.

30. A computer readable medium comprising a computer program stored on a storage device other than an electrical carrier signal, wherein the computer program is configured to execute the method of claim 26 for testing an electronic circuit.

31. The computer readable medium of claim 30, wherein the computer program is contained in a computer memory or in a direct access memory.

32. A method of obtaining a computer program for use in testing an electronic circuit, the method comprising:
    downloading a computer program that implements the method of claim 26 from an electronic data network; and storing the computer program on a computer.

* * * * *

UNITED STATES PATENT AND TRADEMARK OFFICE
CERTIFICATE OF CORRECTION

PATENT NO. : 7,451,373 B2
APPLICATION NO. : 11/367715
DATED : November 11, 2008
INVENTOR(S) : Poehl et al.

It is certified that error appears in the above-identified patent and that said Letters Patent is hereby corrected as shown below:

Column 4, line 42: replace "error signal f'" with -- error signal f' --;
Column 8, line 15: replace "$v_1^{l'}$" with -- $v_1^{l}$ --;
        line 16: replace "$v_2^{l'}$" with -- $v_2^{l}$ --;
        line 17: replace "$v_3^{l'}$" with -- $v_3^{l}$ --;
        line 18: replace "$v_4^{l'}$" with -- $v_4^{l}$ --;
        line 19: replace "$v_5^{l'}$" with -- $v_5^{l}$ --;
        line 20: replace "$v_6^{l'}$" with -- $v_6^{l}$ --;
Column 9, line 65: replace "inputs El" with -- inputs $E_i$ --;
Column 12, line 59: replace "inputs El" with -- inputs $E_i$ --;
Column 14, line 11: replace "compactor K" with -- compactor $K_1$ --;
Column 15, line 57: replace "inputs El" with -- inputs $E_i$ --;
Column 20, line 5: replace "control signal S2" with -- control signal $S_2$ --;
Column 21, line 35: replace "error signal f" with -- error signal f' --;
        line 40: replace "error signal f" with -- error signal f' --;
Column 22, line 3: replace "and f=l" with -- and f'=1 --;
Column 26, line 16: replace "signals v;" with -- signals $v_i$; --;
        line 66: replace "the signal us" with -- the signal $u_1$ --;
Column 30, line 12: replace "claim 3" with -- claim 5 --;
        line 22: replace "connection values" with -- correction values; --;
Column 31, line 1: replace "circuit affangement" with -- circuit arrangement --; and
        line 12: replace "claim 2" with -- claim 4 --.

Signed and Sealed this

Seventh Day of April, 2009

JOHN DOLL
*Acting Director of the United States Patent and Trademark Office*